United States Patent
Himeno et al.

(10) Patent No.: US 6,953,962 B2
(45) Date of Patent: Oct. 11, 2005

(54) NONVOLATILE MEMORY DEVICE HAVING A GATE ELECTRODE

(75) Inventors: Yoshiaki Himeno, Mie-ken (JP); Hiroaki Tsunoda, Mie-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/033,320

(22) Filed: Jan. 12, 2005

(65) Prior Publication Data

US 2005/0127430 A1 Jun. 16, 2005

Related U.S. Application Data

(62) Division of application No. 10/855,403, filed on May 28, 2004, now Pat. No. 6,869,845, which is a division of application No. 10/436,261, filed on May 13, 2003, now Pat. No. 6,770,932.

(30) Foreign Application Priority Data

Jul. 10, 2002 (JP) .......................... 2002-201997

(51) Int. Cl.$^7$ ............................. H01L 29/76
(52) U.S. Cl. .................. 257/314; 257/315; 257/324; 257/326
(58) Field of Search ................. 257/314–316, 257/319–320, 324

(56) References Cited

U.S. PATENT DOCUMENTS

| | | | |
|---|---|---|---|
| 5,190,888 A | * | 3/1993 | Schwalke et al. ........... 438/228 |
| 6,376,879 B2 | * | 4/2002 | Mori et al. .................. 257/347 |
| 6,380,584 B1 | | 4/2002 | Ogawa |
| 6,518,124 B1 | | 2/2003 | Ebina et al. |
| 6,548,862 B2 | | 4/2003 | Ryu et al. |
| 6,756,262 B1 | | 6/2004 | Nakamura et al. |
| 2002/0100929 A1 | | 8/2002 | Ebina et al. |
| 2004/0075133 A1 | | 4/2004 | Nakagawa et al. |

FOREIGN PATENT DOCUMENTS

JP  2002-110822  4/2002

* cited by examiner

*Primary Examiner*—Allan R. Wilson
(74) *Attorney, Agent, or Firm*—Oblon, Spivak, McClelland, Maier & Neustadt, P.C.

(57) ABSTRACT

A nonvolatile memory device having a gate electrode including: a non volatile memory cell configured to store data, and having a first gate electrode, first and second diffusion layers, the first gate electrode having a first top surface and a first side surface; a peripheral transistor having a second gate electrode, third and fourth diffusion layers, the second gate electrode having a second top surface and a second side surface, and a width between the third and fourth diffusion layers of the second gate electrode being wider than that between the first and second diffusion layers of the first gate electrode; a first contact layer connected to the second top surface of the second gate electrode of the peripheral transistor; and a silicon nitride layer formed above the first side surface of the first gate electrode in the non volatile memory cell and the second side surface of the second gate electrode in the peripheral transistor, the silicon nitride layer not being contact with the first contact layer, a thickness of the silicon nitride layer that is formed above the first and second side surfaces of the first and second gate electrodes being uniform approximately.

27 Claims, 47 Drawing Sheets

NONVOLATILE MEMORY DEVICE HAVING A GATE ELECTRODE

CROSS-REFERENCE TO RELATED APPLICATIONS

This application is a Divisional of U.S. patent application Ser. No. 10/855,403, filed May 28, 2004 now U.S. Pat. No. 6,869,845, which is a Divisional of U.S. patent application Ser. No. 10/436,261, filed May 13, 2003 now U.S. Pat. No. 6,770,932, and is based upon and claims the benefit of priority from the prior Japanese Patent Application No.2002-201997, filed Jul. 10, 2002. The entire contents of these applications are incorporated herein by reference.

BACKGROUND OF THE INVENTION

1. Field of the Invention

This present invention relates to a semiconductor memory device and a manufacturing method thereof, for example, a nonvolatile semiconductor memory device and its manufacturing method that are suitable for high integrality.

2. Description of the Related Art

We will explain about a structure of a conventional nonvolatile semiconductor memory device. FIG. 38 shows a schematic top view of the conventional nonvolatile semiconductor memory device. FIG. 38a shows a region where memory cells that are MOS transistors having a floating gate respectively are arranged in an array form, hereinafter, referred to a memory cell region. FIG. 38b shows a region where MOS transistors that have no floating gate and control the memory cells are arranged, hereinafter, referred to a peripheral region.

Generally, the memory cell region is formed with high density in order to achieve high capacity and integrity. Therefore, the peripheral region referred by FIG. 38b is formed with lower density compared to the memory cell region.

As shown in FIG. 38a, in the memory cell region, element regions 161 where memory cells are formed and element isolation regions 162 that separate each of the element regions 161 with each other are arranged in a stripe shape. One of the element regions 161 includes a plurality of memory cells in a horizontal direction of the FIG. 38a. In a direction perpendicular to the element regions 161, gate connection lines 163 that connect each control gates (not shown) with each other are arranged in a stripe shape.

Floating gates (not shown) are arranged in each of intersected portions between the gate connection line 163 and the element region 161. A semiconductor substrate under each of the floating gates works as channel region (not shown). Diffusion layers (not shown) that are used as source or drain regions are arranged in the semiconductor substrate adjacent to the channel region. Each of contact layers 164 is electrically connected to one of the diffusion layers.

FIG. 38b shows a peripheral region. As shown in FIG. 38b, element regions 171 and element isolation regions 172 that electrically separate each of the element regions 161 with each other are arranged in a stripe shape. In a direction perpendicular to the element regions 171, gate connection lines 173 that connect each of gate electrodes (not shown) with each other are arranged in a stripe shape.

Gate electrode regions (not shown) are arranged in each of intersected portions between the gate connection line 173 and the element region 171. A semiconductor substrate under each of the gate electrode regions works as channel region (not shown). Diffusion layers (not shown) that are used as source or drain regions are arranged in the semiconductor substrate adjacent to the channel region. Each of contact layers 174 is electrically connected to one of the diffusion layers. Each of contact layers 175 is electrically connected to one of the diffusion layers. In the peripheral region shown in FIG. 38b, MOS transistors are arranged in lower integrity than that of the memory cell region shown in FIG. 38a.

Hereinafter, steps of manufacturing such as the nonvolatile memory device will be shown schematically with reference to FIG. 39 to FIG. 42. Each of FIG. 39a to FIG. 42a shows a cross sectional view similar to an A–Aa cross sectional view shown in FIG. 38a. Each of FIG. 39b to FIG. 42b shows a cross sectional view similar to a B–Ba cross sectional view shown in FIG. 38a. Each of FIG. 39c to FIG. 42c shows a cross sectional view similar to a C–Ca cross sectional view shown in FIG. 38b. Also, same reference numbers will be commonly fed to same portions over FIG. 39 to FIG. 42.

As shown in FIG. 39, a gate insulation film 102 is formed on a semiconductor substrate 101. A poly crystalline silicon layer 103 formed on the gate insulation film 102 and a poly crystalline silicon layer 107 formed thereon are used as a floating gate in the memory cell region (See FIGS. 39a and 39b) and are used as a part of the gate electrode in the peripheral region (See FIG. 39c).

A reference number 108 in FIGS. 39a and 39b shows a second gate insulating film which is, for instance, comprised of an ONO (Oxide-Nitride-Oxide) layer. A poly crystalline silicon layer 109 and a WSi (Tungsten Silicide) layer 110 are formed on the second gate insulating film. The poly crystalline silicon layer 109 is used as the gate connection line 163. Silicon oxide layers 111 and 112 are formed on the WSi layer 110. The WSi layer 110 is also used as a part of the control gate electrode in the memory cell region.

As shown in FIG. 39c, the WSi layer 110 is used as a part of the gate electrode in the peripheral region. It should be noted that, as shown in FIG. 39, a silicon oxide layer 112 is formed above upper surfaces of the gate electrode in the memory cell region and the peripheral region, and on side surfaces of the gate electrode in the memory cell region and the peripheral region at this stage.

As shown in FIG. 40, a silicon nitride layer 113 with 40 nm in thickness is formed on the silicon oxide layer 112 by using a low pressure CVD (Chemical Vapor Deposition) method. A BPSG (Boron phosphor Silicate Glass) layer 114 with 400 nm in thickness is formed on the silicon nitride layer 113 in order to fulfill intervals between the gate electrodes by using a normal pressure CVD method. After that, the BPSG layer 114 is reflowed by adding heat with 850 degrees centigrade and nitrogen atmosphere. Moreover, a BPSG layer 115 with 300 nm in thickness is formed on the BPSG layer 114. After that, the BPSG layer 115 is reflowed by adding heat with 850 degrees centigrade and nitrogen atmosphere. Simultaneously, dopants in the diffusion layer 129 are diffused.

As shown in FIG. 41, by using a CMP (Chemical Mechanical Polishing) method, parts of the BPSG layer 114 and 115 are removed so as to expose upper surfaces of the silicon nitride layer 113. A silicon oxide layer 116 with 100 nm in thickness is formed by using a plasma CVD method. And then, a photo resist layer (not shown) is formed on the silicon oxide layer 116 and is processed into a desirable pattern by using a photolithography technique. Parts of the silicon oxide layer 116, the BPSG layer 114, and 115 are removed by using the patterned resist layer as a mask and RIE (Reactive Ion Etching) method, thereby forming a first contact hole 117a.

The patterned photo resist layer is removed. And then, by using RIE (Reactive Ion Etching) method and the patterned silicon oxide layer 116 as a mask, the silicon nitride layer 113 and the gate insulating layer 102 that are located under a bottom surface of the contact hole 117a are removed so as to expose an upper surface of the semiconductor substrate 101. Formations that are formed on a side surface of the contact hole 117a at the RIE method are removed. After that, by using a CVD method, a tungsten layer 117 with 400 nm in thickness is formed so as to cover the silicon oxide layer 116 and fulfill the contact hole 117a.

As shown in FIG. 42, by using a CMP method, parts of the tungsten layer 117 and the silicon oxide layer 116 are removed so as to expose upper surfaces of the silicon nitride layer 113 in order to flatten and identify heights of an upper surface of the tungsten layer 117 and the silicon nitride layer 113. A silicon oxide layer 118 with 450 nm in thickness is formed on the silicon nitride layer 113 and the tungsten layer 117 by using a plasma CVD method. A photo resist layer (not shown) is then formed on the silicon oxide layer 118 and patterned into a predetermined pattern by using a photo lithography technique. By using a RIE method and the patterned resist layer as a mask, a second contact hole 119a is formed so as to reach upper surfaces of the tungsten layer 117 that is formed in the contact hole 117a (FIG. 42b) and the WSi layer 110 that will be used as a gate electrode (FIG. 42c).

The patterned photo resist layer is removed. And then, a second tungsten layer 119 with 250 nm in thickness is formed so as to cover an upper surface of the silicon oxide layer 118 and fulfill the second contact hole 119a. Steps that are going to be done afterward are omitted.

As stated above, the contact layer (the contact layers 164 in FIG. 38a or the tungsten layer 117, and the second tungsten layer 119 in FIG. 42b) that reaches a source or drain region of the memory cell is formed in the memory cell region. Also, the contact layers that reach a source or drain region of the peripheral MOS transistor (the contact layers 174 in FIG. 38b, and the tungsten layer 117 and the second tungsten layer 119 in FIG. 42c) and reach a gate electrode of the peripheral MOS transistor (the contact layers 175 in FIG. 38b, and the second tungsten layer 119 in FIG. 42c) are formed in the peripheral region.

As shown in FIGS. 38 and 42, a pattern density of the contact layers in a region where the contact layers are formed depends on whether the contact layer is connected to a source/drain region or a gate electrode. Also, as stated above, forming the contact layers is done by forming at least two contact holes and then fulfill such conductive layers as the tungsten layers in each of the at least two contact holes.

It is necessary that not only parts of the silicon oxide layers 118, 112, and 111 but also a part of the silicon nitride layer 113 are removed in order to form the second contact hole 119a. Therefore, in this case, it is not desirable that parts of the silicon oxide layer and the silicon nitride layer are removed by using a RIE method with a sufficient etching ratio between the silicon oxide layer and the silicon nitride layer. If the silicon oxide layer and the silicon nitride layer were removed under the condition, as shown in FIG. 43a, the silicon nitride layer that is located in the contact hole 119a could not be removed totally and a part of the silicon nitride layer in the contact hole 119a could remain. Therefore, a connection defect between the second tungsten layer 119 and the WSi layer 110 (the gate electrode) may happen.

If the silicon oxide layer and the silicon nitride layer were removed without a sufficient etching ratio between the silicon oxide layer and the silicon nitride layer, the connection defect between the second tungsten layer 119 and the WSi layer 110 that is stated above could be avoided. However, as shown in FIG. 43b, it may happen that the second contact holes 119a in a high density region (for instance, a memory cell region) are formed not to coincide with the contact hole 117a.

In this case, when the contact hole 119a is formed by using an etching technique, it is difficult to make a position of a bottom surface of the contact hole 119a stopped at a position of an upper surface of the tungsten layer 117. For this reason, portions of the insulating layer 114, the silicon oxide layers 111, 112, and the silicon nitride layer 113 could be removed, thereby exposing a side surface of the WSi layer 110 and shorting between the second tungsten layer 110 that is exposed in the contact hole 119a and the WSi layer 110 that is used as a control gate.

Actually, we can not perfectly avoid a position difference between the bottom surface of the contact hole 119a and the upper surface of the tungsten layer 117. As the integrality of the memory cells and the peripheral transistors progressed, specifically, the problem stated above tends to happen in the memory cell region that is formed with a high integrality

SUMMARY OF INVENTION

A first aspect of the present invention is providing a nonvolatile memory device having a gate electrode comprising: a non volatile memory cell configured to store data, and having a first gate electrode, first and second diffusion layers, the first gate electrode having a first top surface and a first side surface; a peripheral transistor having a second gate electrode, third and fourth diffusion layers, the second gate electrode having a second top surface and a second side surface, and a width between the third and fourth diffusion layers of the second gate electrode being wider than that between the first and second diffusion layers of the first gate electrode; a first contact layer connected to the second top surface of the second gate electrode of the peripheral transistor; and a silicon nitride layer formed above the first side surface of the first gate electrode in the non volatile memory cell and the second side surface of the second gate electrode in the peripheral transistor, the silicon nitride layer not being contact with the first contact layer, a thickness of the silicon nitride layer that is formed above the first and second side surfaces of the first and second gate electrodes being uniform approximately.

A second aspect of the present invention is providing a nonvolatile memory device having a gate electrode comprising: a non volatile memory cell configured to store data, and having a first gate electrode, first and second diffusion layers, the first gate electrode having a first top surface and a first side surface; a peripheral transistor having a second gate electrode, third and fourth diffusion layers, the second gate electrode having a second top surface and a second side surface, and a width between the third and fourth diffusion layers of the second gate electrode being wider than that between the first and second diffusion layers of the first gate electrode; a first contact layer connected to the second top surface of the second gate electrode of the peripheral transistor; an insulation layer which is directly formed on the top surface of the second gate electrode in the peripheral transistor; a silicon nitride layer formed above the first side surface of the first gate electrode in the non volatile memory cell and the second side surface of the second gate electrode in the peripheral transistor; and an interlayer insulting layer that is formed above the nonvolatile memory cell and the peripheral transistor and is directly contact with the first contact layer and the insulation layer.

DETAILED DESCRIPTION OF THE INVENTION

Figure 1A:
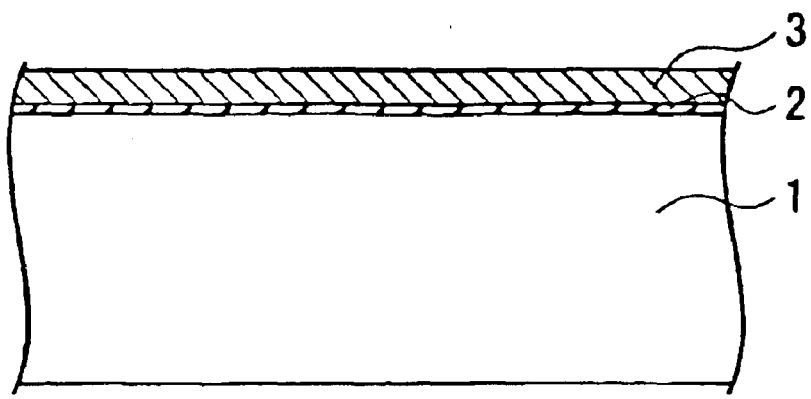
FIG. 1 shows a manufacturing step of a non-volatile memory device associated with a first embodiment of the present invention.
Figure 1B:
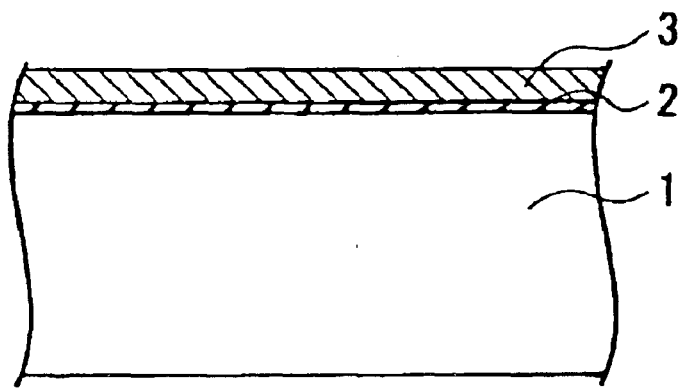
Figure 1C:
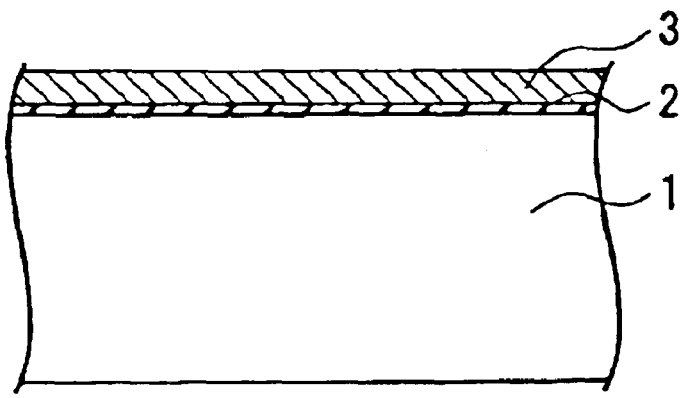
Figure 2A:
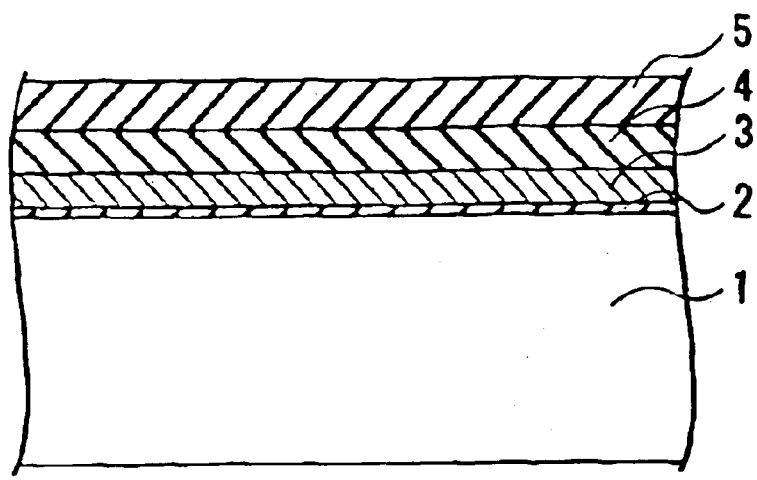
FIG. 2 shows a manufacturing step of the non-volatile memory device associated with the first embodiment of the present invention, and the manufacturing step is subsequent to FIG. 1.
Figure 2B:
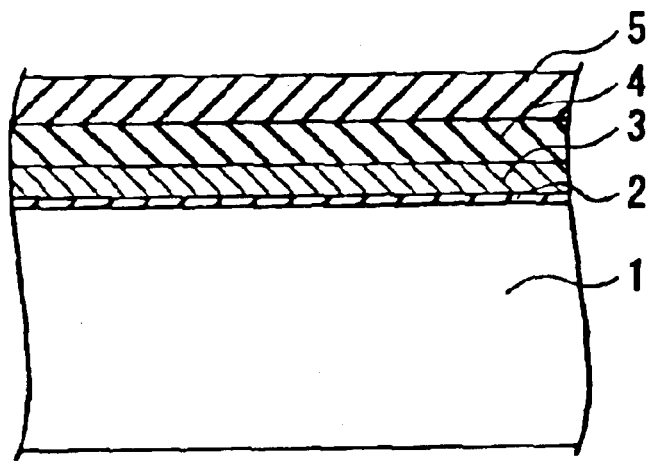
Figure 2C:
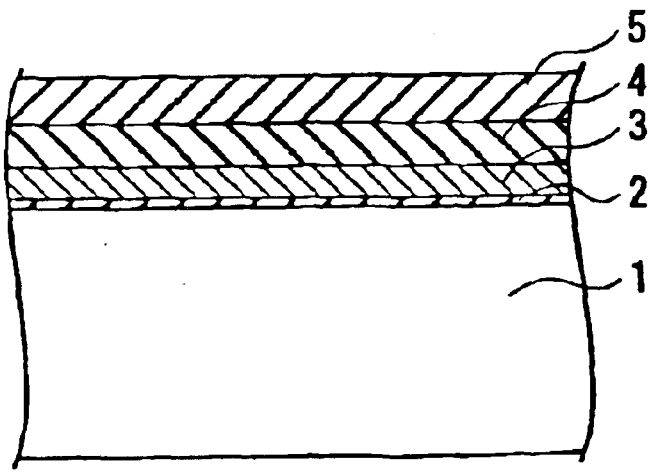
Figure 4A:
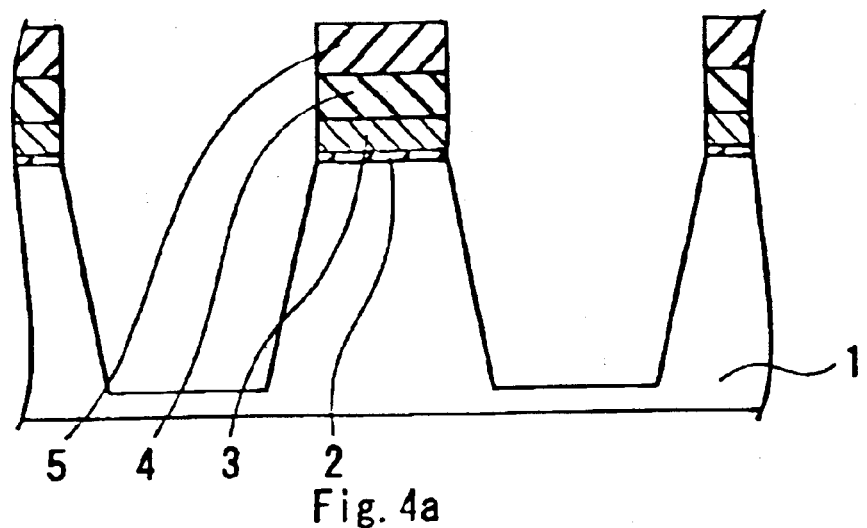
FIG. 4 shows a manufacturing step of the non-volatile memory device associated with the first embodiment of the present invention, and the manufacturing step is subsequent to FIG. 3.
Figure 4B:
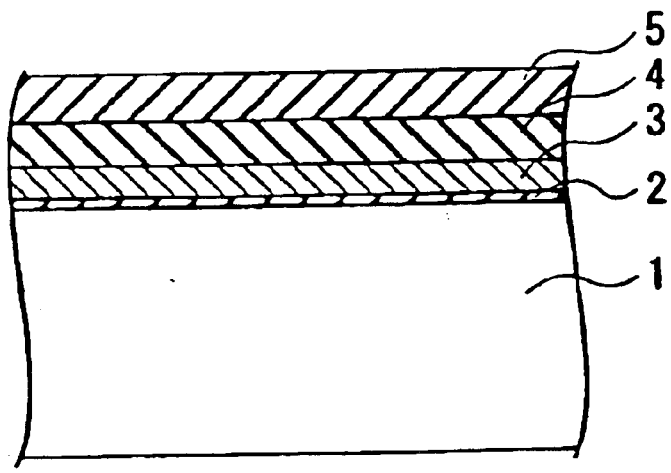
Figure 4C:
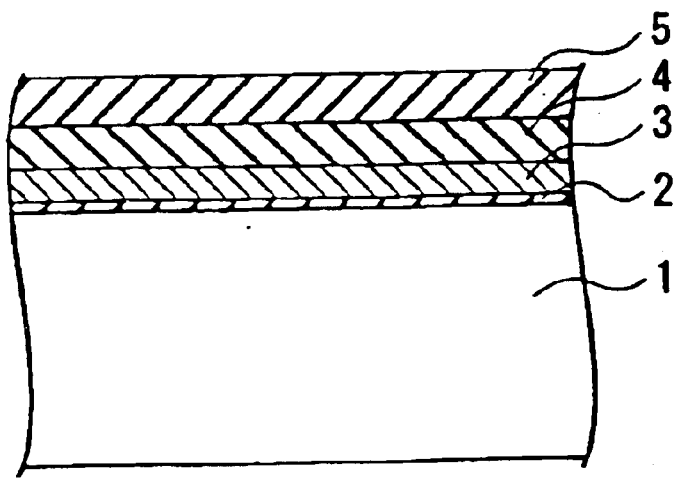
Figure 5A:
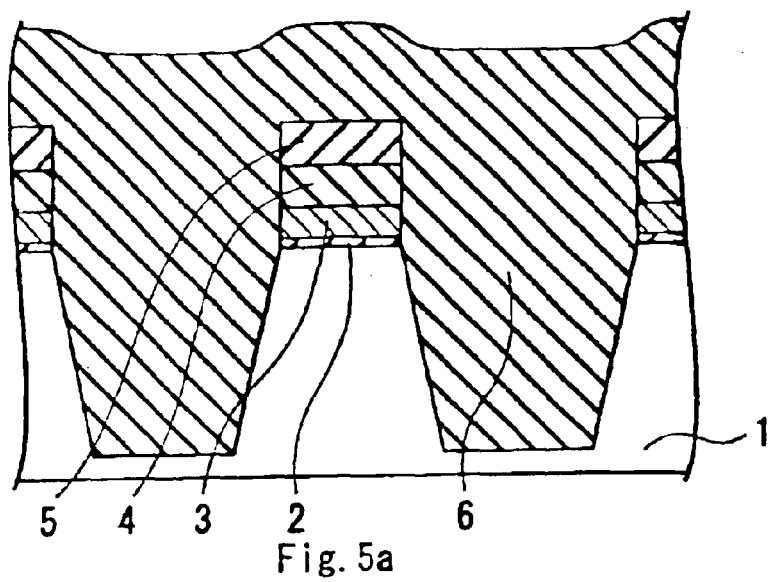
FIG. 5 shows a manufacturing step of the non-volatile memory device associated with the first embodiment of the present invention, and the manufacturing step is subsequent to FIG. 4.
Figure 5B:
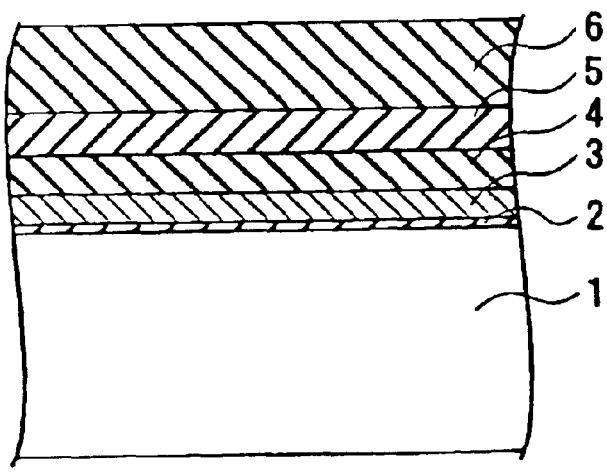
Figure 5C:
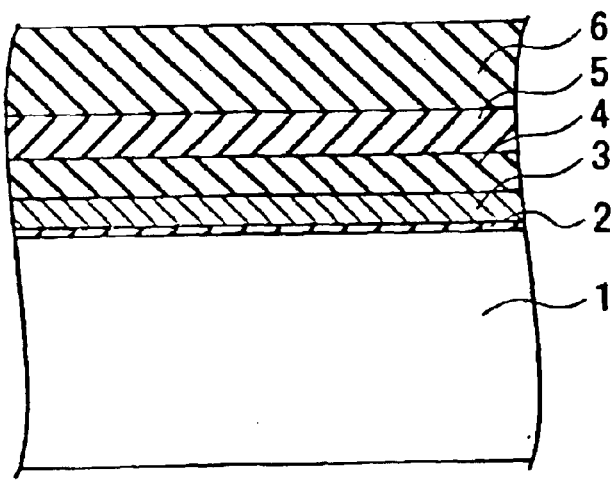
Figure 38A:
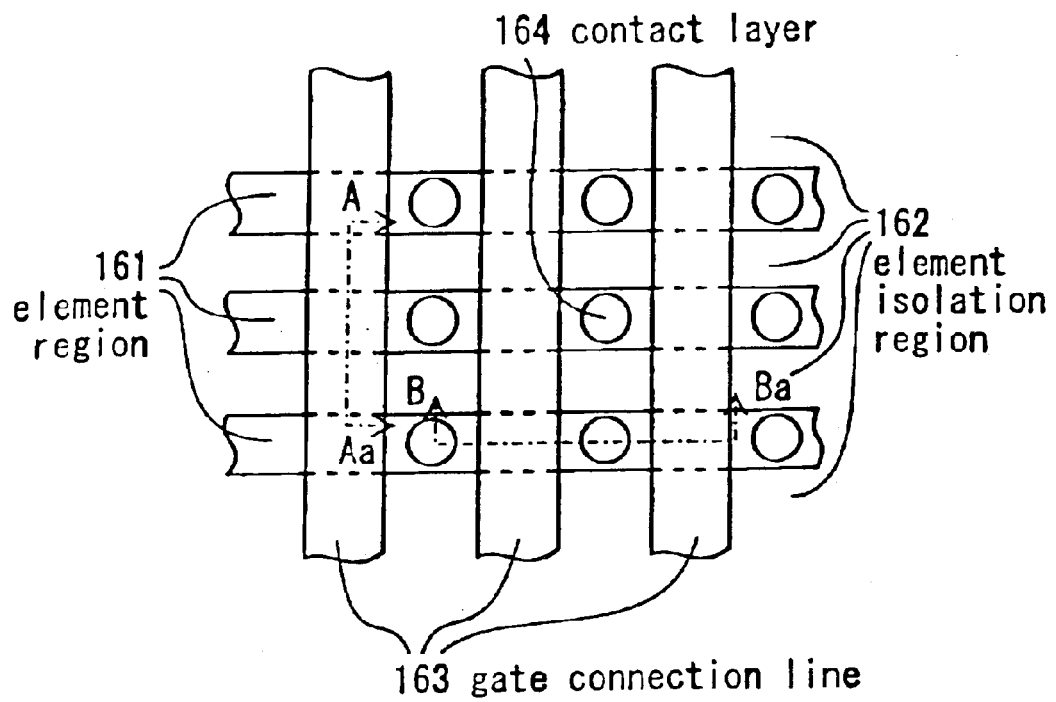
FIG. 38 shows a schematic diagram that depicts a structural exemplary of a top view of a non-volatile memory device.
Figure 38B:
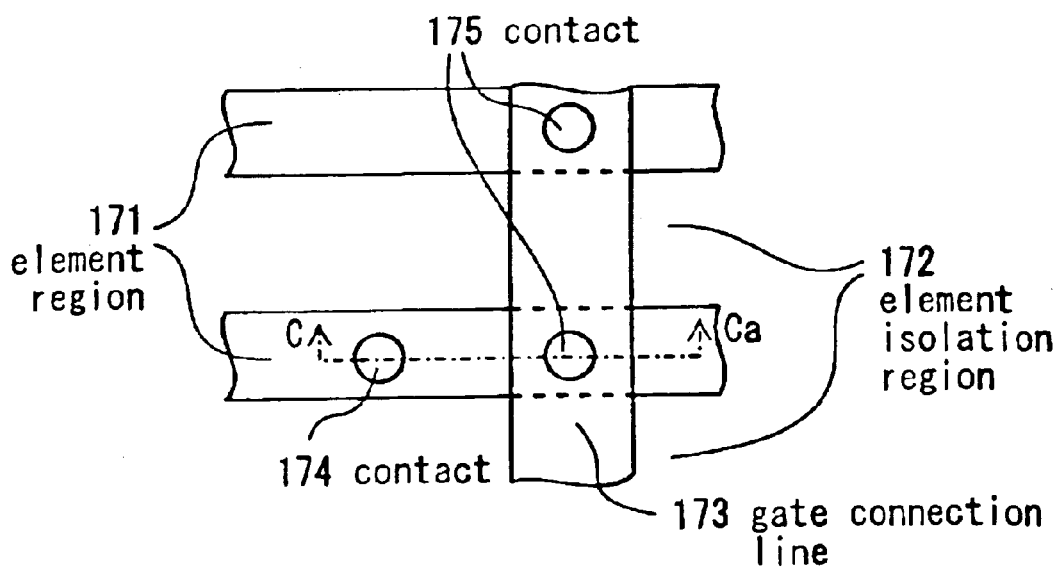
Figure 39A:
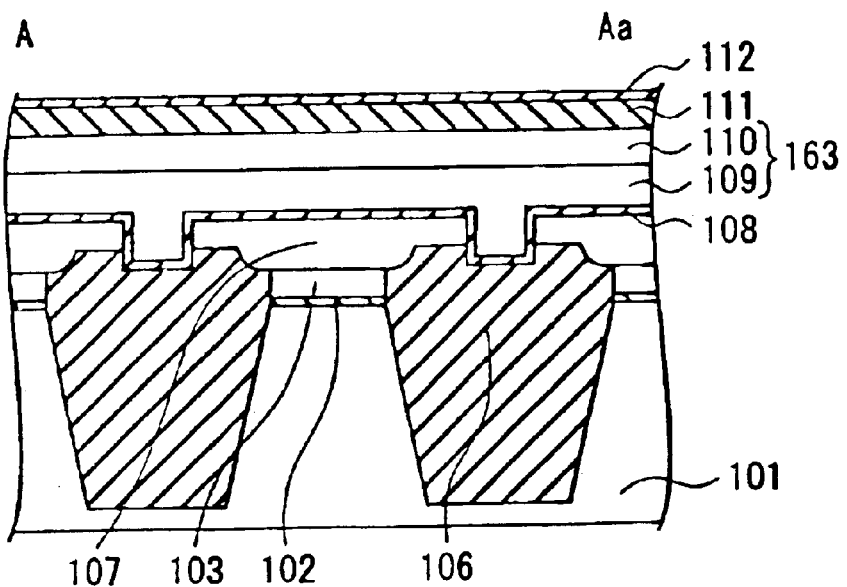
FIG. 39 schematically shows a manufacturing step of a conventional non-volatile memory device.
Figure 39B:
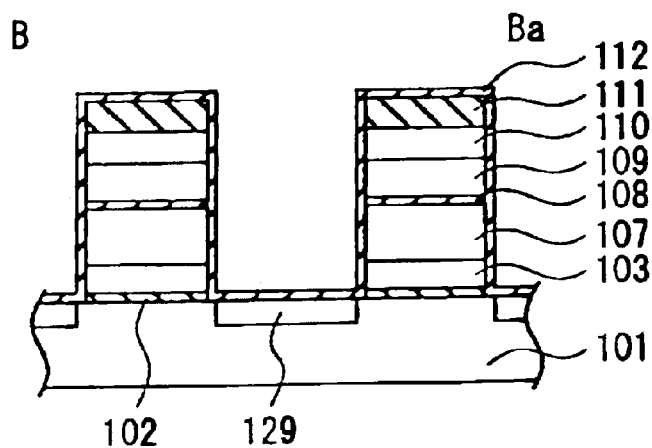
Figure 39C:
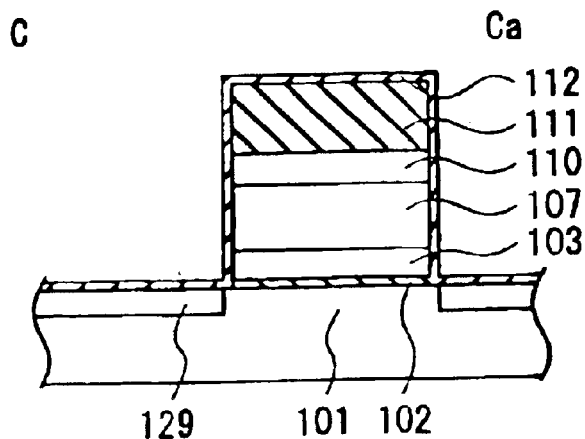
Figure 40A:
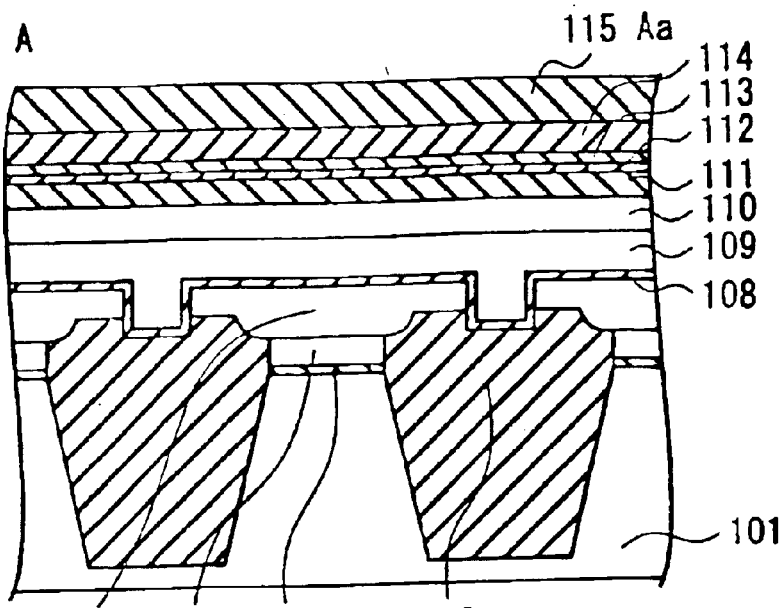
FIG. 40 schematically shows a manufacturing step of the conventional non-volatile memory device, and is subsequent to FIG. 39.
Figure 40B:
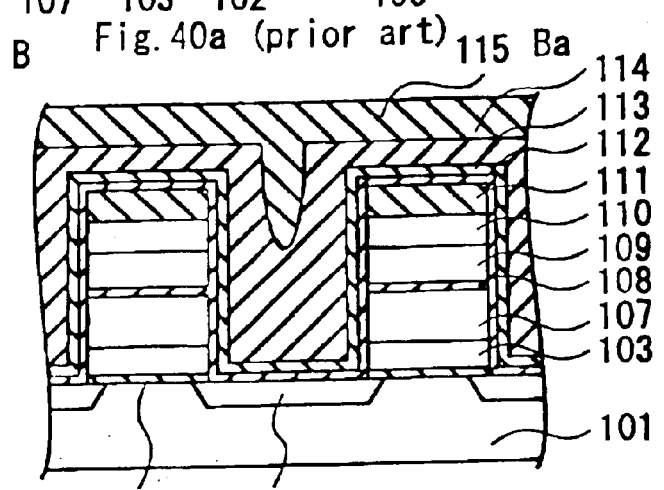
Figure 40C:
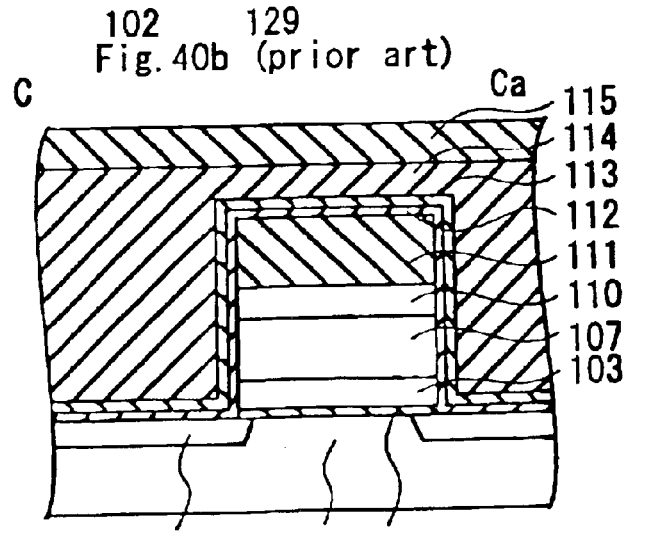
Figure 41A:
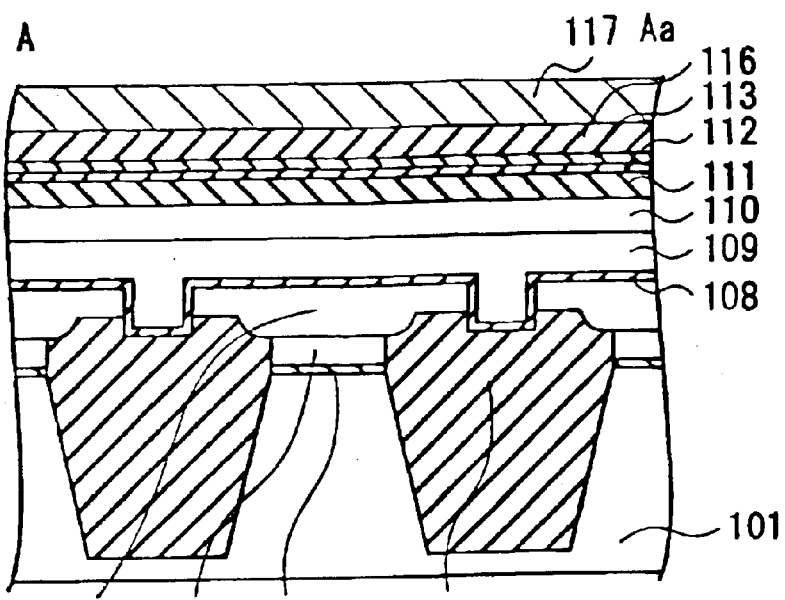
FIG. 41 schematically shows a manufacturing step of the conventional non-volatile memory device, and is subsequent to FIG. 40.
Figure 41B:
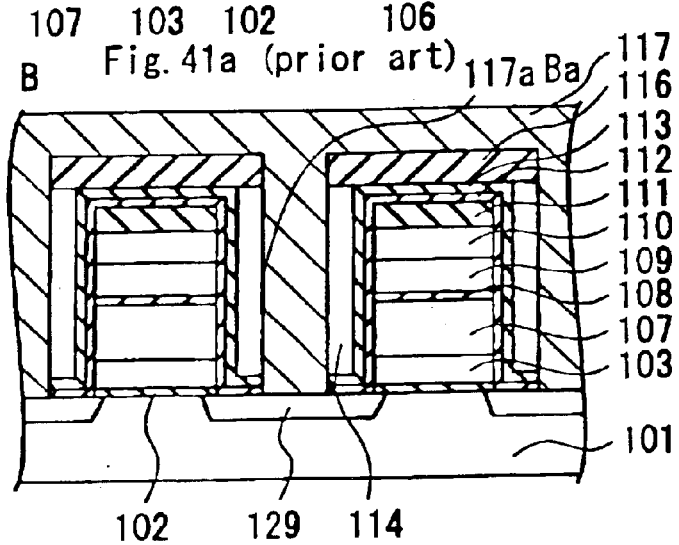
Figure 41C:
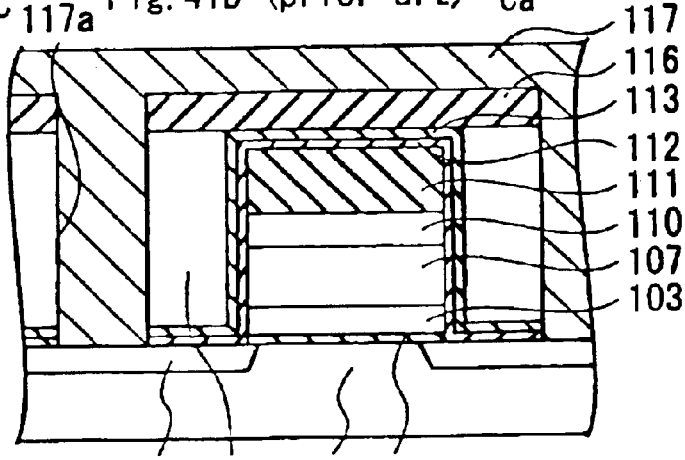
Figures 42A, 42B, 42C:
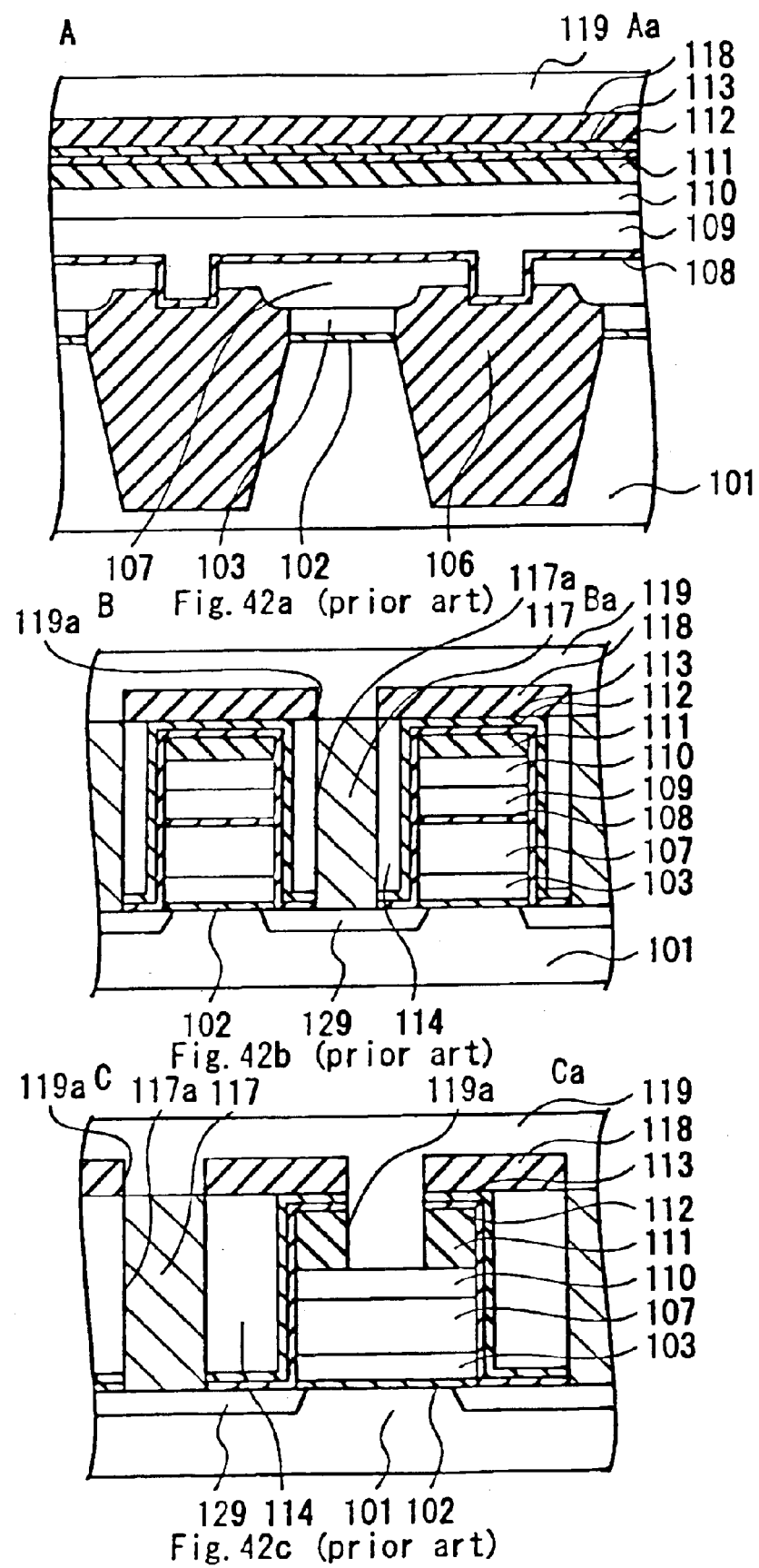
FIG. 42 schematically shows a manufacturing step of the conventional non-volatile memory device, and is subsequent to FIG. 41.
Figure 43A:
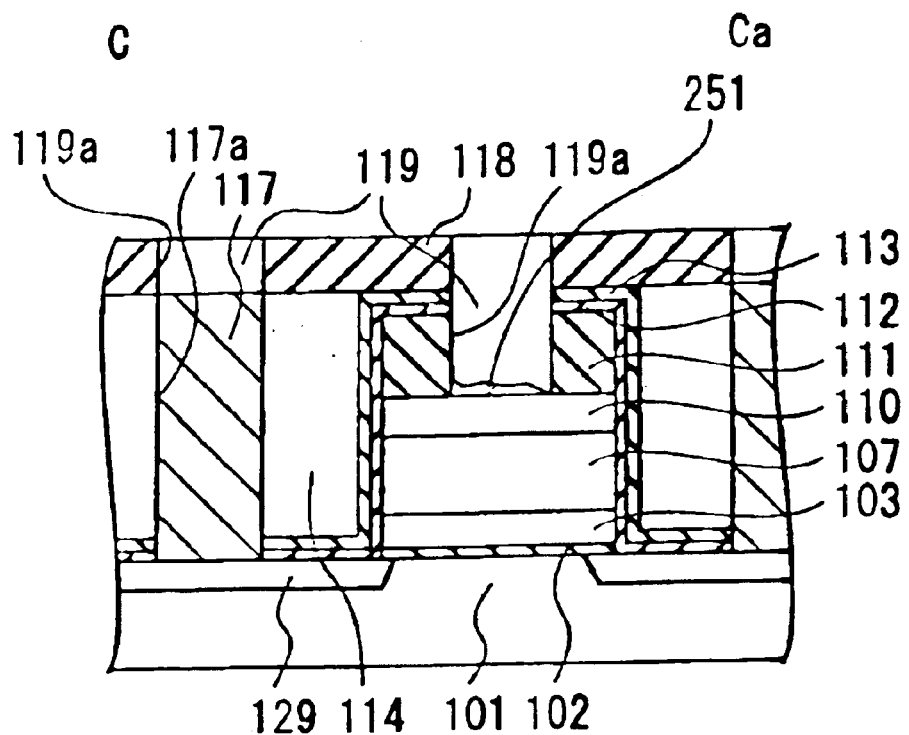
FIG. 43 shows a schematic diagram for explaining about a problem of the conventional non-volatile memory device.
Figure 43B:
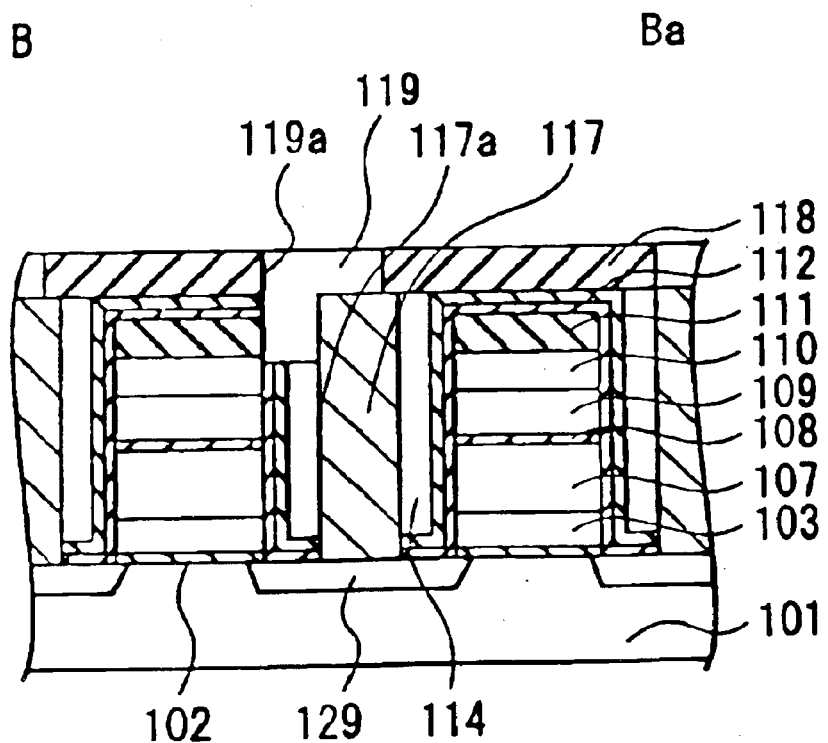

Hereinafter, we will explain about an embodiment of the present invention with reference to drawings. FIGS. 1, 2, and 5 show manufacturing steps of a non volatile memory device of a first embodiment in the present invention. Each of FIGS. 1a to 25a is same as an A–Aa cross sectional view of FIG. 38a. Each of FIGS. 1b to 25b is same as a B–Ba cross sectional view of FIG. 38a. Each of FIGS. 1c to 25c is same as a C–Ca cross sectional view of FIG. 38a. Same reference numbers used in FIG. 38 are assigned to same portions in FIGS. 1 to 25.

(First Embodiment)

First, as shown in FIG. 1, a first gate insulating film 2 with, for instance, 9 nm in thickness is formed on a semiconductor substrate 1. A polycrystalline silicon layer 3 with, for instance, 60 nm in thickness is then formed on the first gate insulating film 2 by using a low pressure CVD (Chemical Vapor Deposition) method. As shown in FIG. 2, a silicon nitride layer 4 with, for instance, 70 nm in thickness is formed on the polycrystalline silicon layer 3 by using a low pressure CVD method. A silicon oxide layer with, for instance, 230 nm in thickness is then formed on the silicon nitride layer 4.

Figure 3A:
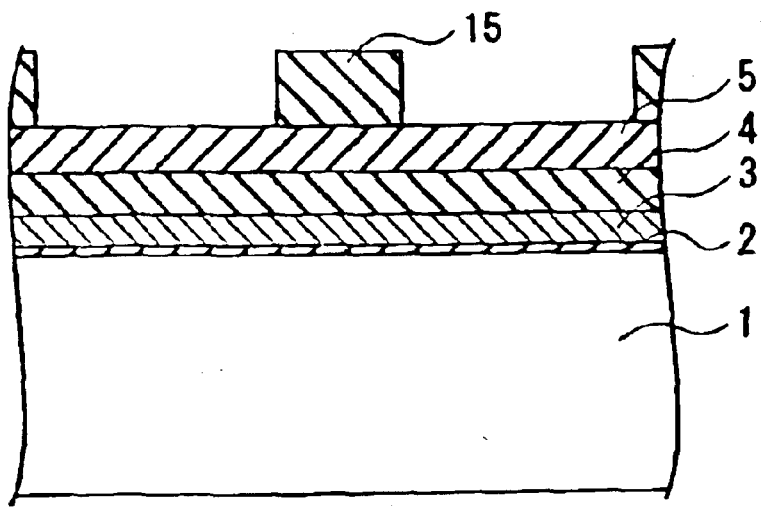
FIG. 3 shows a manufacturing step of the non-volatile memory device associated with the first embodiment of the present invention, and the manufacturing step is subsequent to FIG. 2.
Figure 3B:
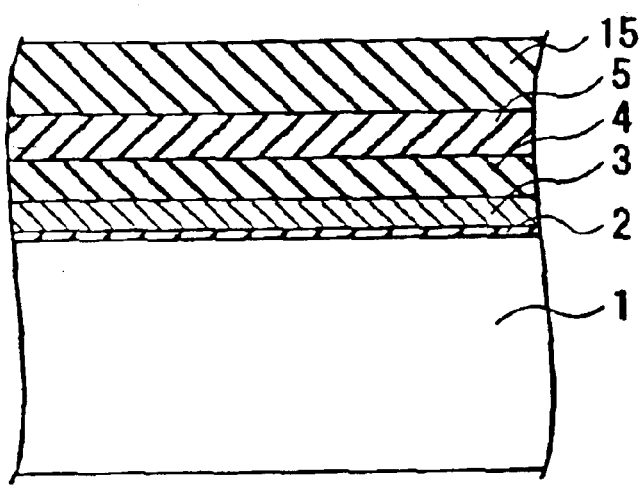
Figure 3C:
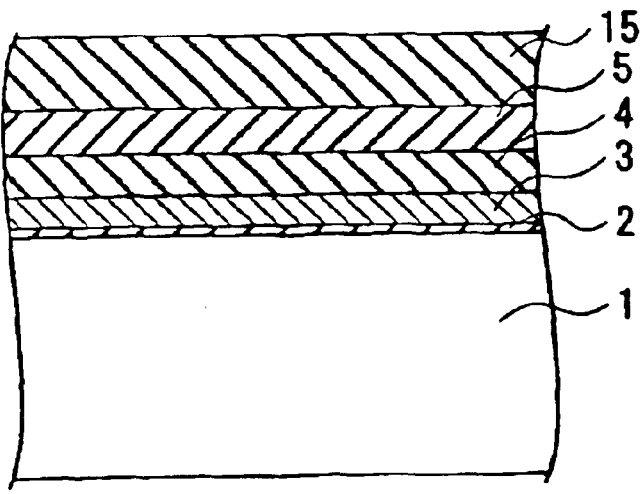

As shown in FIG. 3, a photo resist layer 15 is formed on the silicon oxide layer 5 and is processed into a stripe pattern for directions of B–Ba and C–Ca by using a photolithography technique. As shown in FIG. 4, portions of the silicon oxide layer 5 and the silicon nitride layer 4 are removed by using a RIE (Reactive Ion Etching) method and using the patterned photo resist layer as a mask. After the patterned photo resist layer is removed, portions of the polycrystalline silicon layer 3, the first gate insulation film 2, and the semiconductor substrate 1 are removed to form grooves in the semiconductor substrate 1 by using a RIE method and using a silicon oxide layer 5 as a mask.

Figure 6A:
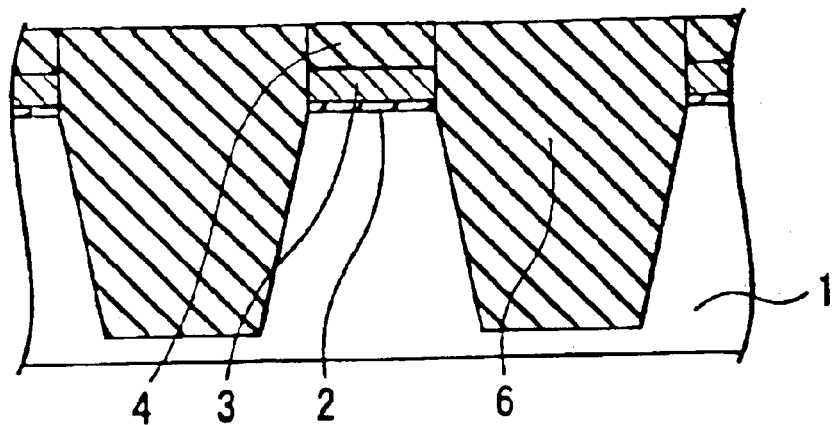
FIG. 6 shows a manufacturing step of the non-volatile memory device associated with the first embodiment of the present invention, and the manufacturing step is subsequent to FIG. 5.
Figure 6B:
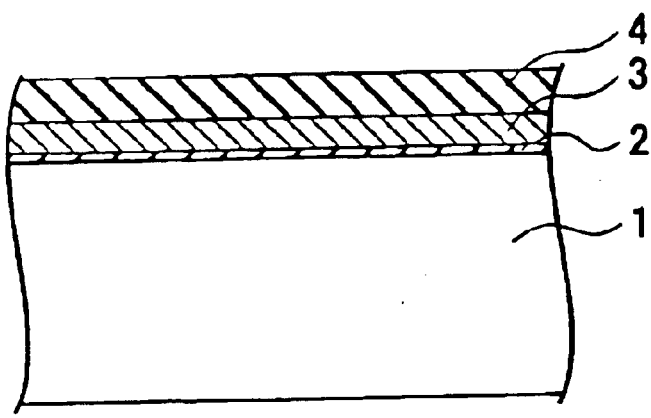
Figure 6C:
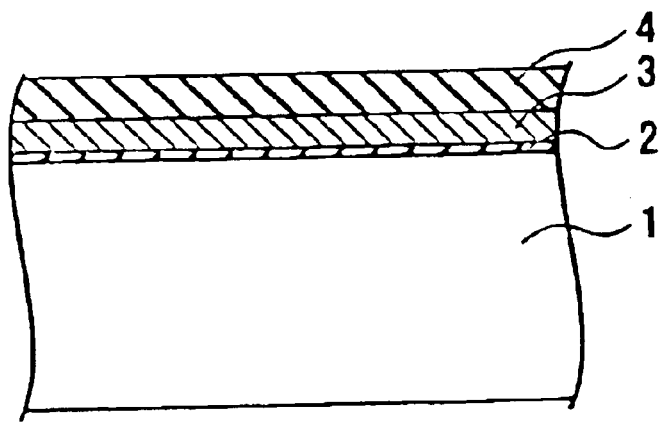
Figure 7A:
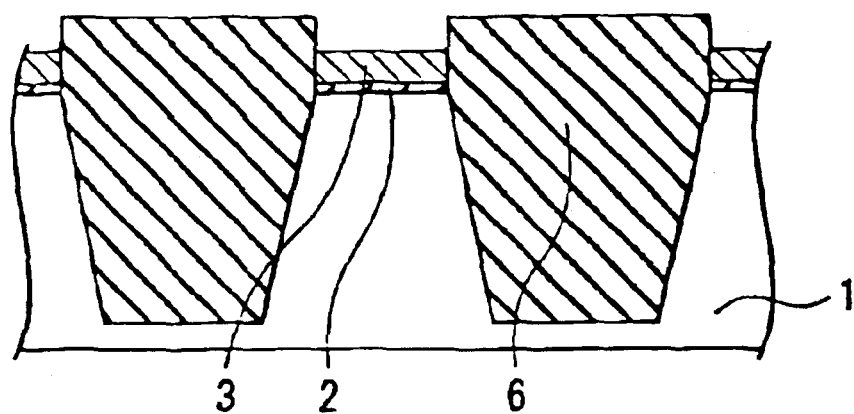
FIG. 7 shows a manufacturing step of the non-volatile memory device associated with the first embodiment of the present invention, and the manufacturing step is subsequent to FIG. 6.
Figure 7B:
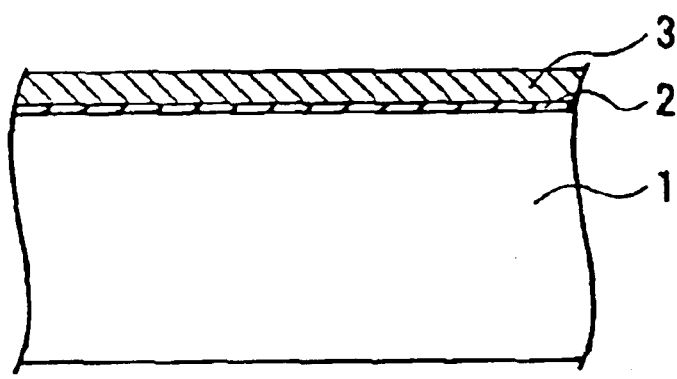
Figure 7C:
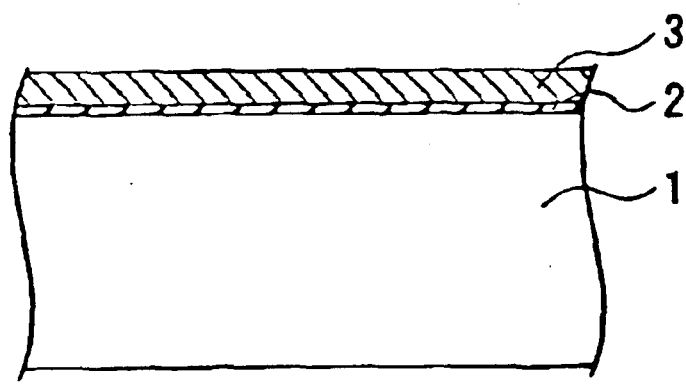

As shown in FIG. 5, a silicon oxide layer 6 with, for instance, 540 nm in thickness is formed in the grooves and on the silicon oxide layer 5 by using a HDP method. As shown in FIG. 6, portion of the silicon oxide layer 6 is removed and flattened so as to expose an upper surface of the silicon nitride layer 4 by using a CMP method. Moreover, as shown in FIG. 7, the upper surface of the silicon nitride layer 6 is etched to some extent by using a process of buffered fluoric acid. The silicon nitride layer 4 is then removed by using a process of phosphorous acid so as to expose an upper surface of the polycrystalline silicon layer 3. A STI structure with the silicon oxide layer 6, that is used as an element isolation region, is formed by the steps that are already stated.

Figure 8A:
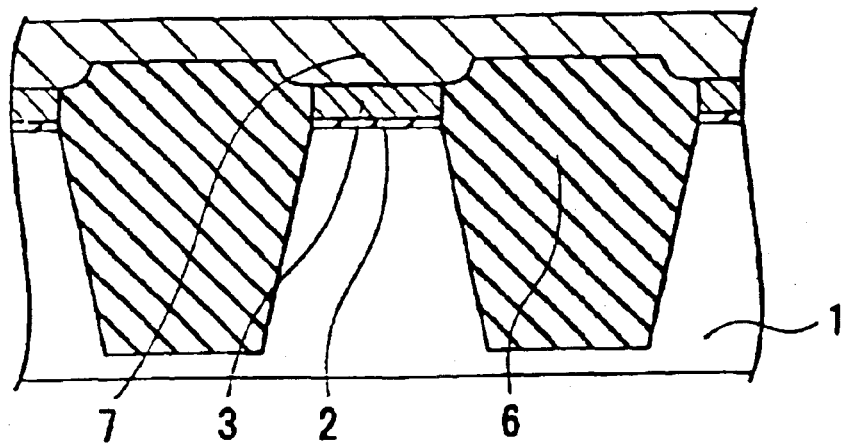
FIG. 8 shows a manufacturing step of the non-volatile memory device associated with the first embodiment of the present invention, and the manufacturing step is subsequent to FIG. 7.
Figure 8B:
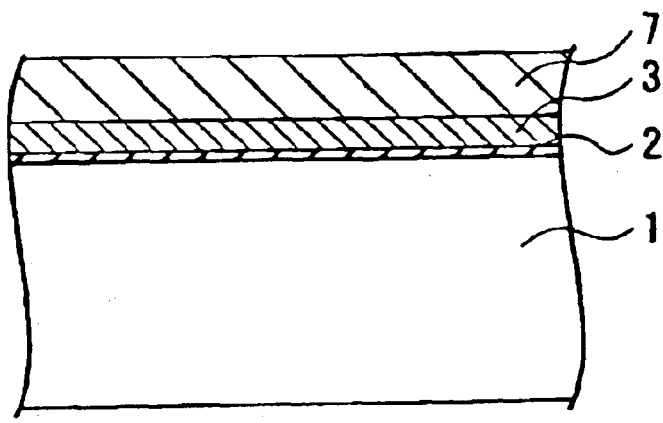
Figure 8C:
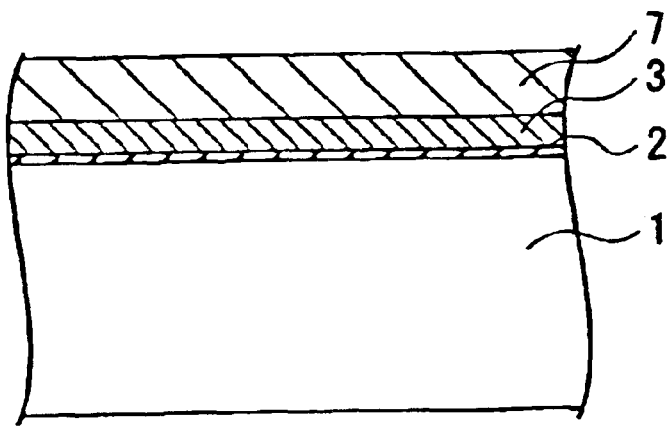

As shown in FIG. 8, a poly crystalline silicon layer 7 with, for instance, 100 nm in thickness is formed on the silicon oxide layer 6 and the polycrystalline silicon layer 3 by using a low pressure CVD method. A photo resist layer (not shown) formed on the poly crystalline silicon layer 7 is patterned by using a photo lithography method, thereby resulting in forming the photo resist layer with a predetermined stripe pattern (B–Ba direction).

Figure 9A:
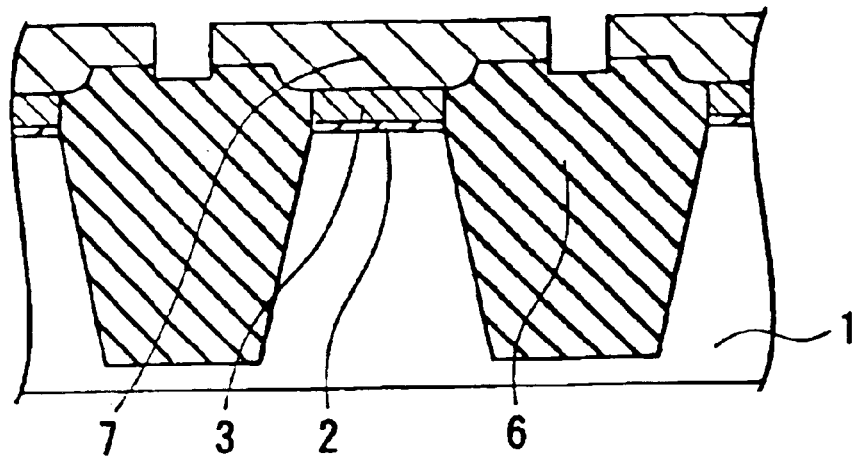
FIG. 9 shows a manufacturing step of the non-volatile memory device associated with the first embodiment of the present invention, and the manufacturing step is subsequent to FIG. 8.
Figure 9B:
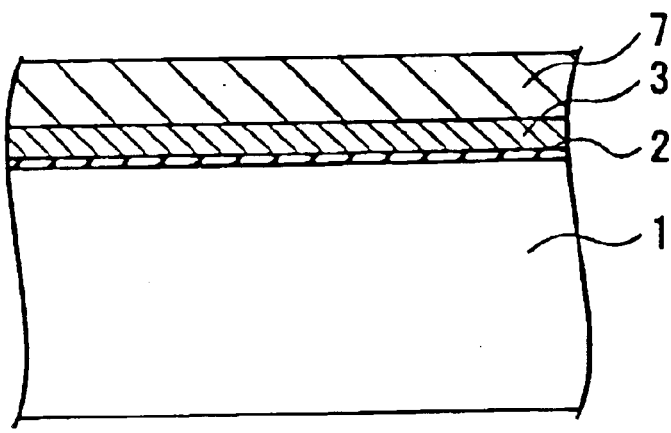
Figure 9C:
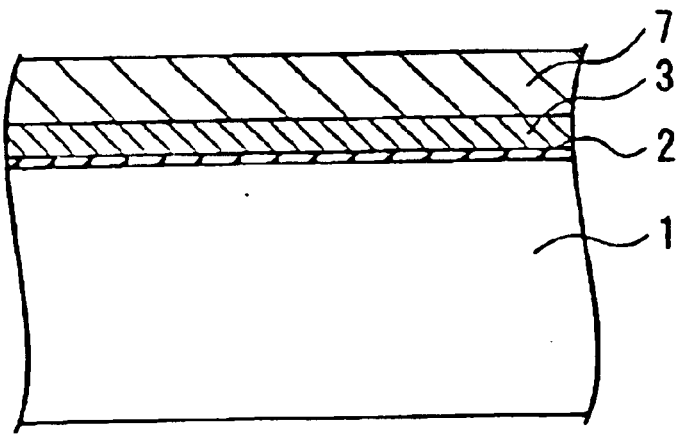

As shown in FIG. 9, by using a RIE method and forming the photo resist layer with a predetermined stripe pattern as a mask, portions of the poly crystalline silicon layer 7 are removed, thereby exposing upper surfaces of the silicon oxide layer 6.

Figure 10A:
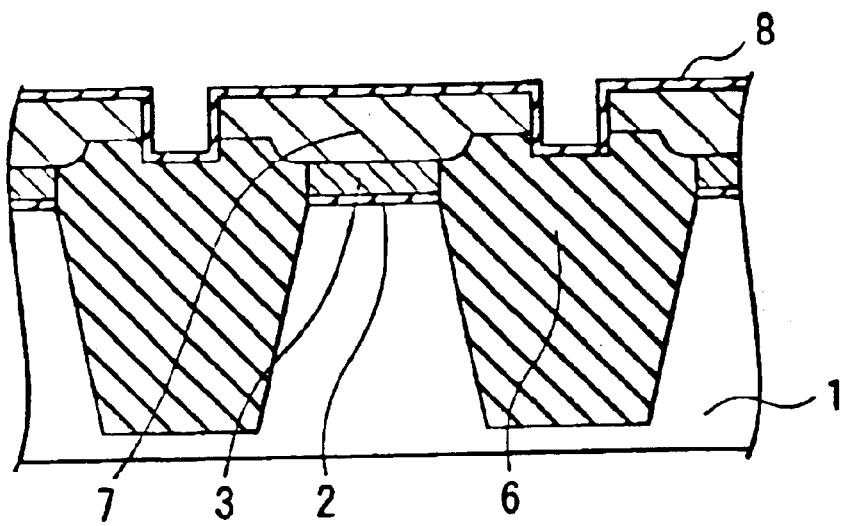
FIG. 10 shows a manufacturing step of the non-volatile memory device associated with the first embodiment of the present invention, and the manufacturing step is subsequent to FIG. 9.
Figure 10B:
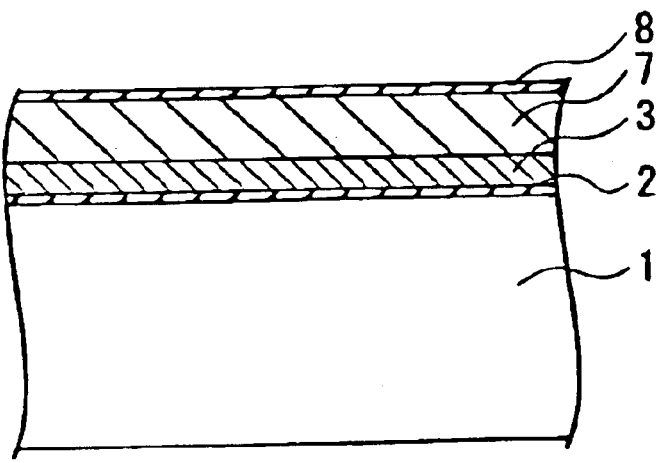
Figure 10C:
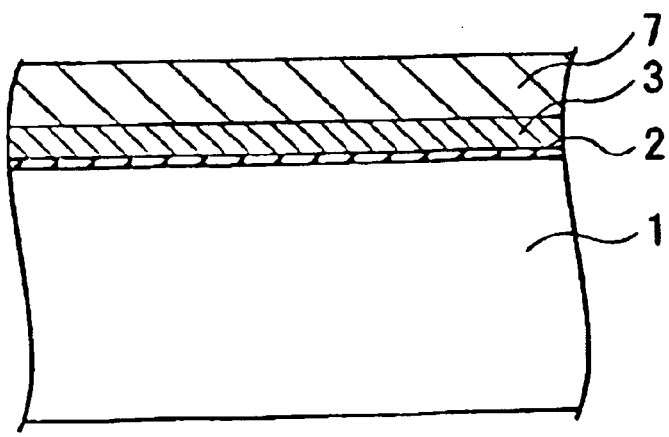

After removal of the patterned photo resist layer, as shown in FIG. 10, a second gate insulating film 8 comprising an ONO (Oxide-SiN-Oxide) film with, for instance, 17 nm (thickness of the Oxide film, the SiN film, and the Oxide film is 5 nm, 7 nm, and 5 nm respectively) in total thickness, is formed on predetermined regions (element regions) of the poly crystalline silicon layer 7 by using a low pressure CVD method.

Figure 11A:
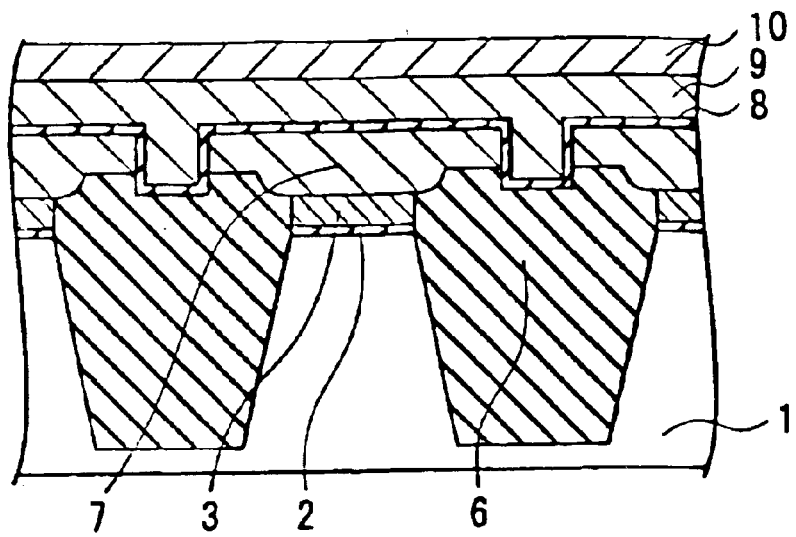
FIG. 11 shows a manufacturing step of the non-volatile memory device associated with the first embodiment of the present invention, and the manufacturing step is subsequent to FIG. 10.
Figure 11B:
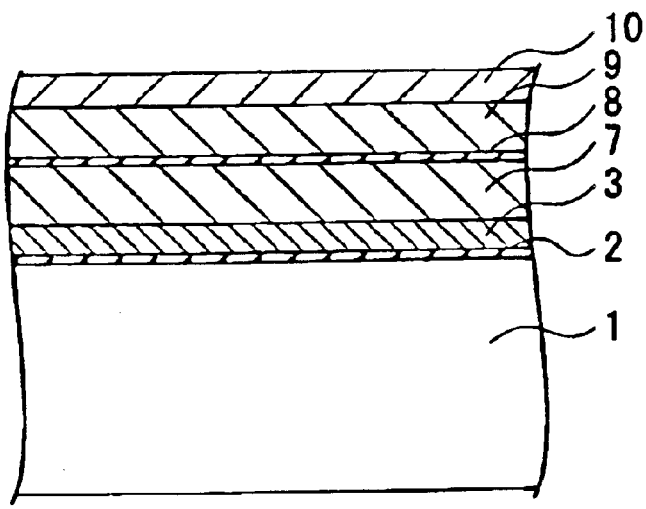
Figure 11C:
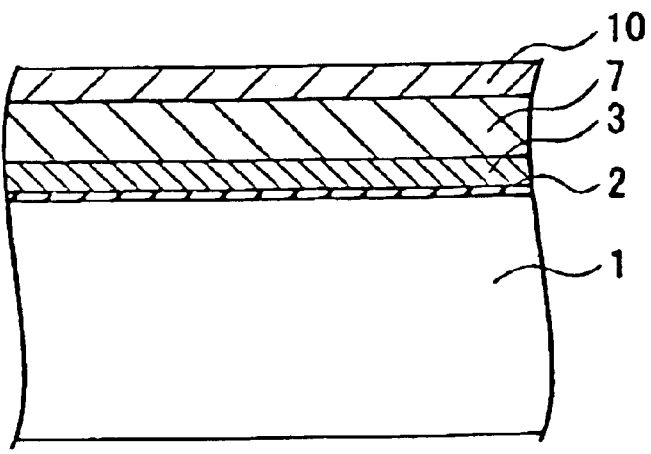

As shown in FIG. 11, a poly crystalline silicon layer 9 with, for instance, 100 nm in thickness is formed on the second gate insulating film 8 by using a low pressure CVD method. A tungsten silicide layer 10 (WSi) with, for instance, 100 nm in thickness is then formed on the poly crystalline silicon layer 9 by using a PVD method.

Figure 12A:
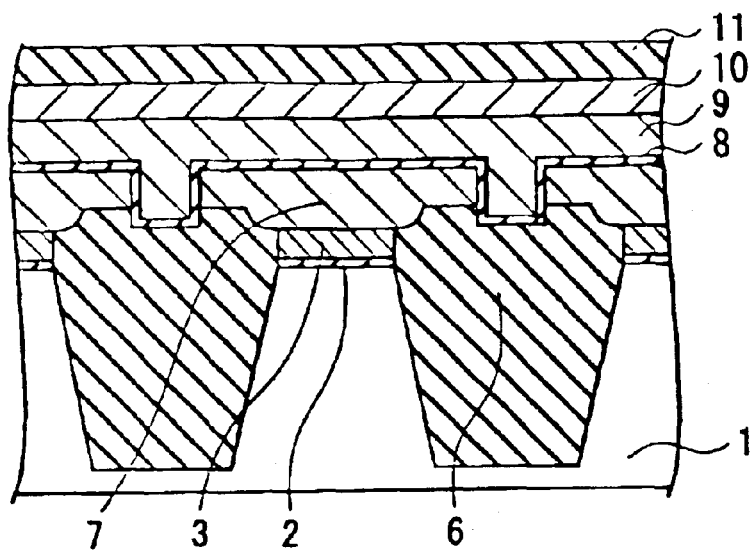
FIG. 12 shows a manufacturing step of the non-volatile memory device associated with the first embodiment of the present invention, and the manufacturing step is subsequent to FIG. 11.
Figure 12B:
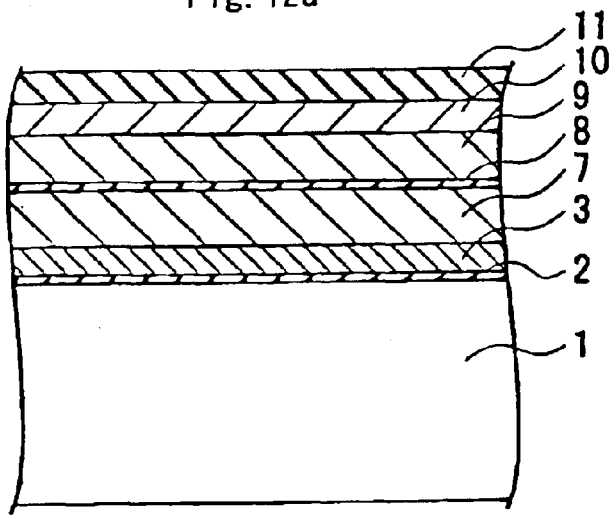
Figure 12C:
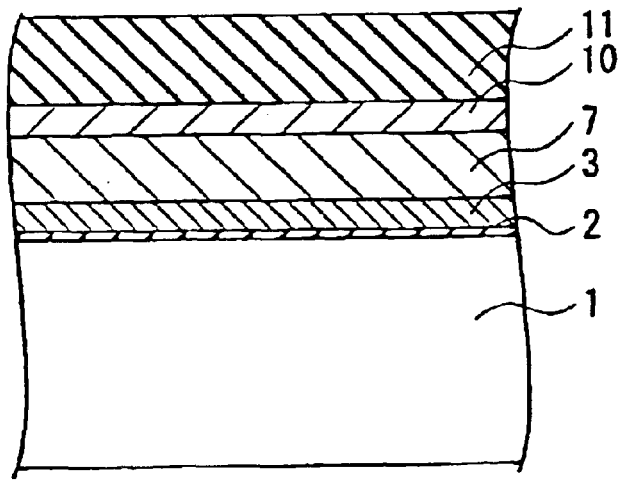

After that, as shown in FIG. 12, a silicon oxide layer 11, which is used as a mask layer for forming a gate electrode (a control gate electrode), is formed on the tungsten silicide layer 10 by using a low pressure CVD method. For example, a thickness of the silicon oxide layer 11 is 230 nm.

Figure 13A:
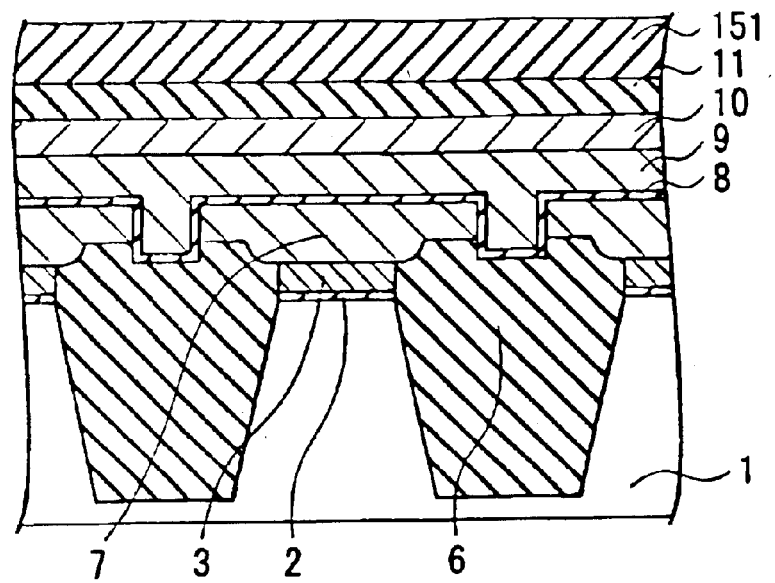
FIG. 13 shows a manufacturing step of the non-volatile memory device associated with the first embodiment of the present invention, and the manufacturing step is subsequent to FIG. 12.
Figure 13B:
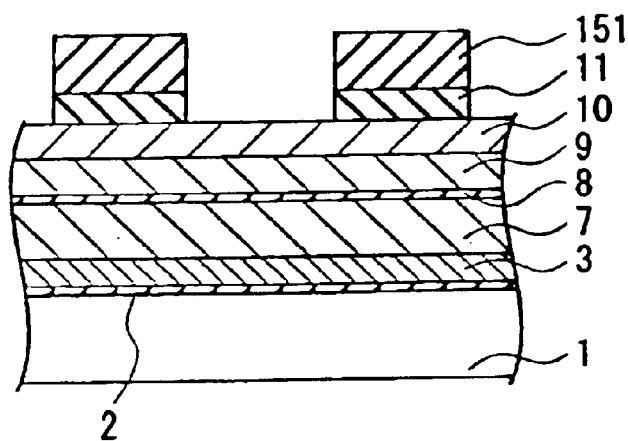
Figure 13C:
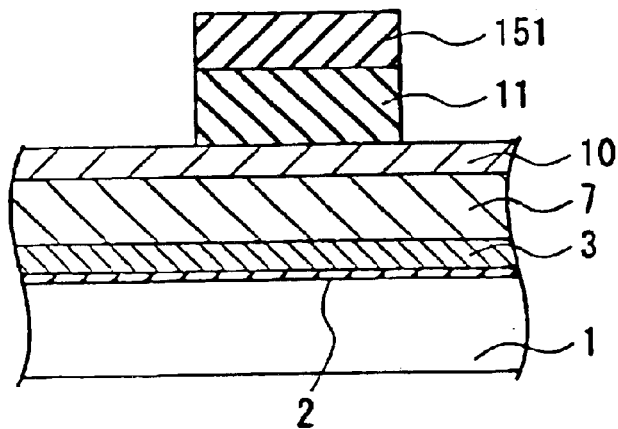

As shown in FIG. 13, by using a RIE method and using a patterned photo resist layer 151 as a mask, portions of the silicon oxide layer 11 are removed. After that, the patterned photo resist layer 151 is removed by using a process of O2 plasma, and a process of mixture solution of sulfuric acid and hydrogen peroxide.

Figure 14A:
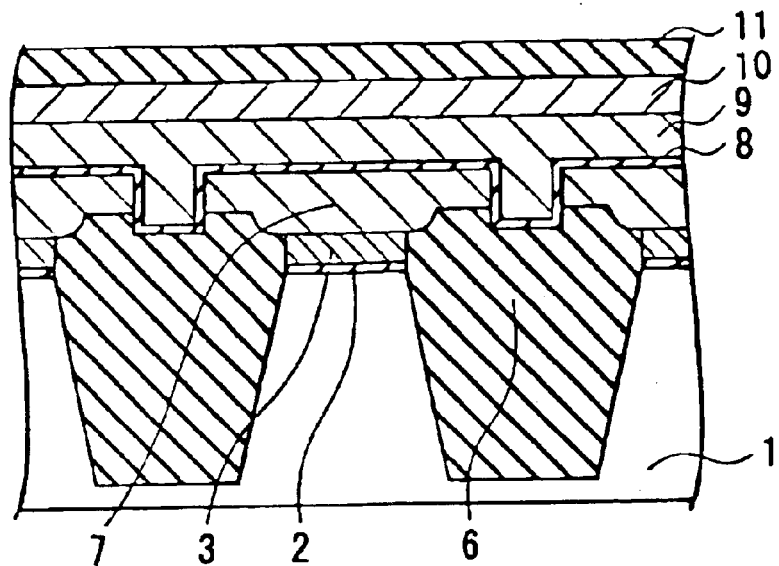
FIG. 14 shows a manufacturing step of the non-volatile memory device associated with the first embodiment of the present invention, and the manufacturing step is subsequent to FIG. 13.
Figure 14B:
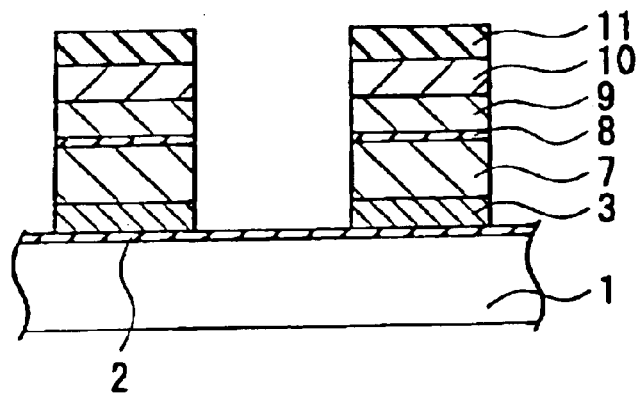
Figure 14C:
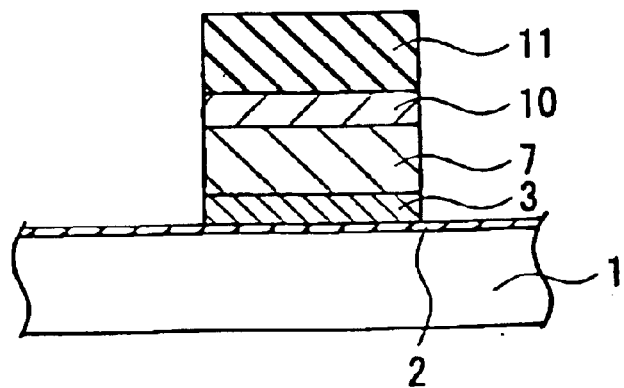

As shown in FIG. 14, by using a RIE method and using the processed silicon oxide layer 11 as a mask, portions of the tungsten silicide layer 10, the poly crystalline silicon layer 9, the second gate insulating film 8, the poly crystalline silicon layer 7, and the poly crystalline silicon layer 3 are removed, thereby forming gate structures.

Figure 15A:
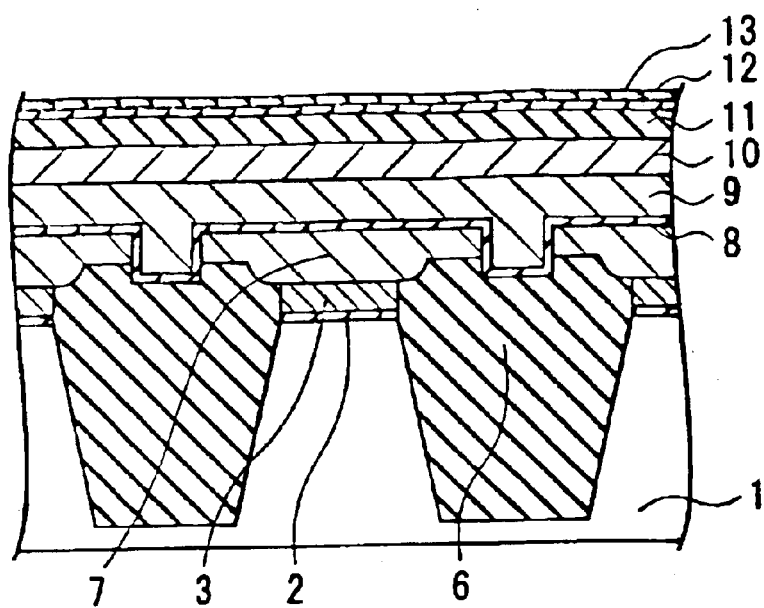
FIG. 15 shows a manufacturing step of the non-volatile memory device associated with the first embodiment of the present invention, and the manufacturing step is subsequent to FIG. 14.
Figure 15B:
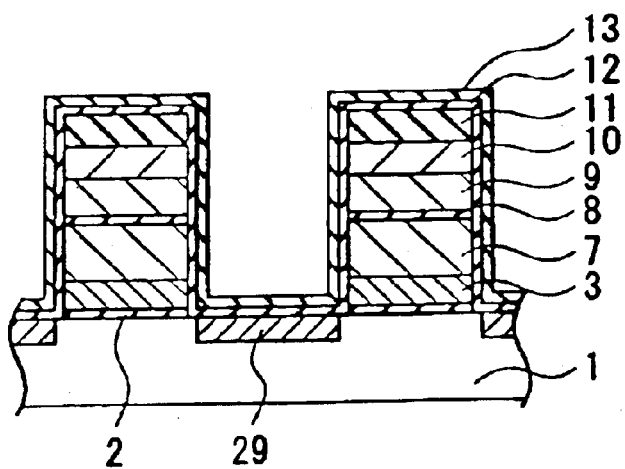
Figure 15C:
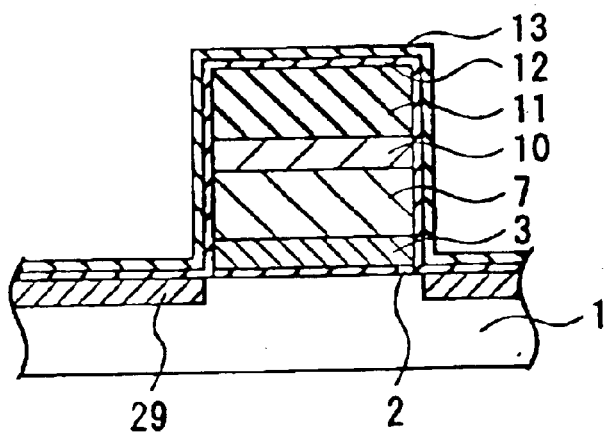

As shown in FIG. 15, a silicon oxide layer 12 is formed on upper and side surfaces of the gate structures by adding heat with, for instance, 800 degrees centigrade, 120 seconds, and nitrogen atmosphere, and then adding heat with, for instance, 1000 degrees centigrade and oxygen atmosphere. Impurities are then injected into the semiconductor substrate 1 by using an ion implantation method, thereby forming source and drain regions 29. Sequentially, a silicon nitride layer 13 with, for instance, 40 nm in thickness is formed on the silicon oxide layer 12 and the source and drain regions 29 by using a low pressure CVD method. As shown in FIG. 15, a thickness of the silicon nitride layer 13 is uniform approximately. Therefore, it is noted that the silicon nitride layer 13 shown in FIG. 15 should be extinguished from a side wall insulation film of a LDD (Lightly Doped Drain) structure.

Figure 16A:
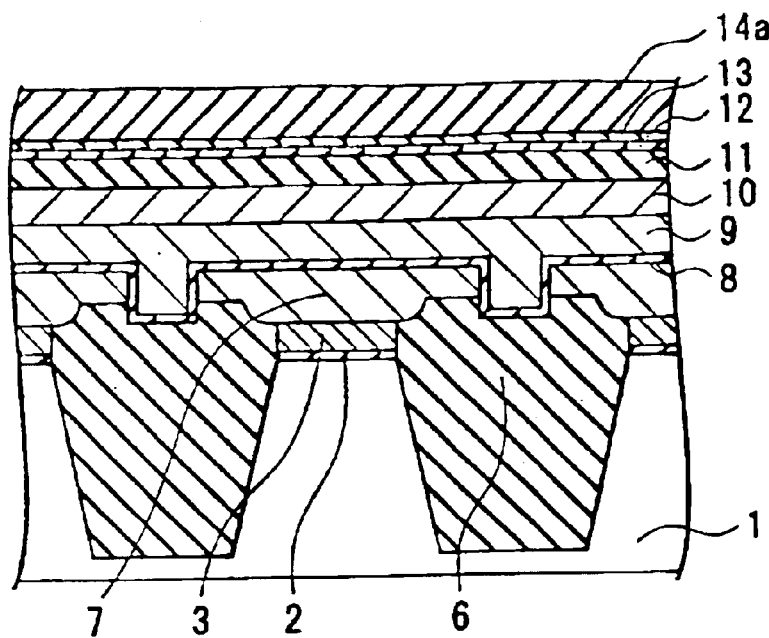
FIG. 16 shows a manufacturing step of the non-volatile memory device associated with the first embodiment of the present invention, and the manufacturing step is subsequent to FIG. 15.
Figure 16B:
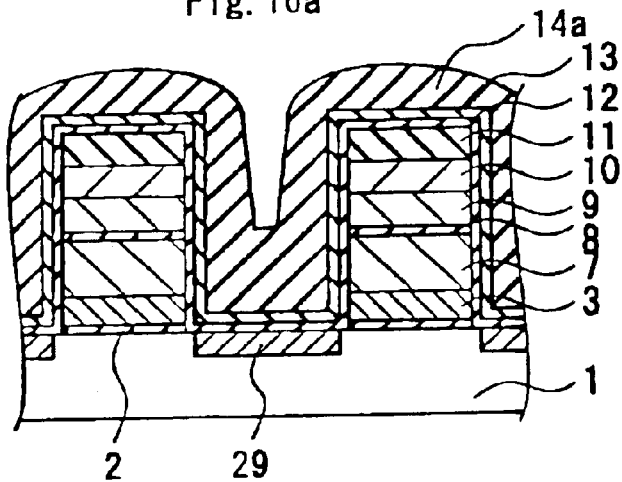
Figure 16C:
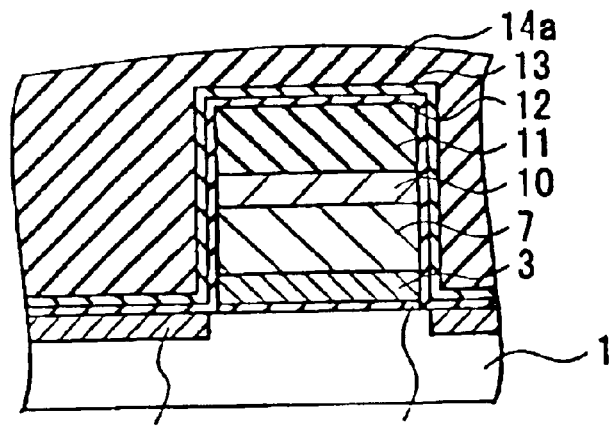

As shown in FIG. 16, a first insulating layer 14a (BPSG layer) with, for instance, 400 nm in thickness is formed on the silicon nitride layer 13 by using a CVD method. After that, the first insulating layer 14a (BPSG layer) is reflowed by adding heat with, for instance, 850 degrees centigrade, 30 minutes, and nitrogen atmosphere.

Figure 17A:
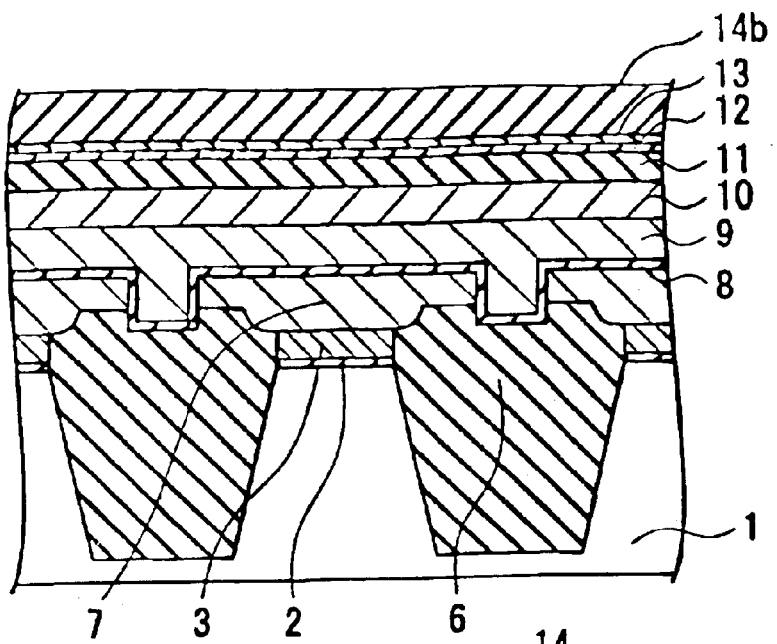
FIG. 17 shows a manufacturing step of the non-volatile memory device associated with the first embodiment of the present invention, and the manufacturing step is subsequent to FIG. 16.
Figure 17B:
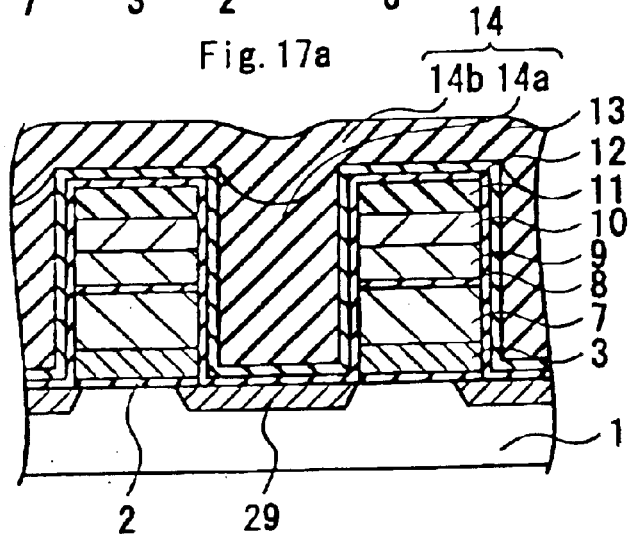
Figure 17C:
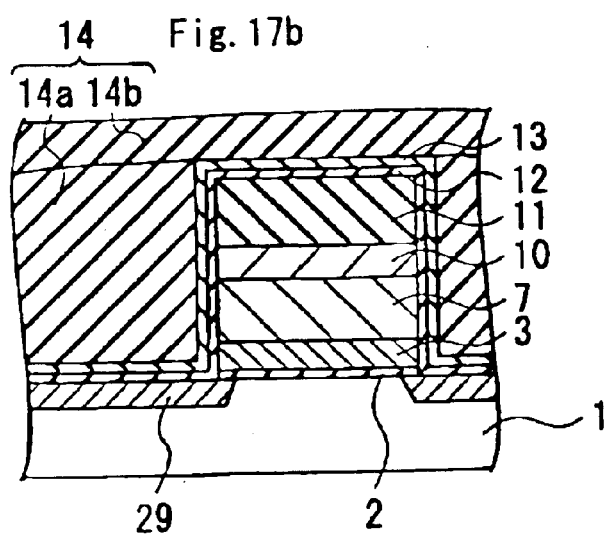

As shown in FIG. 17, a second insulating layer 14b (BPSG layer) with, for instance, 300 nm is then formed on the first insulating layer 14a (BPSG layer). After that, the second insulating layer 14b (BPSG layer) is reflowed by adding heat with, for instance, 850 degrees centigrade, 30 minutes, and nitrogen atmosphere. Also, during the heat process, the impurities injected into the semiconductor substrate 1 are diffused. Hereinafter, the first insulating layer 14a and the second insulating layer 14b will be referred to as an insulating layer 14.

Figure 18A:
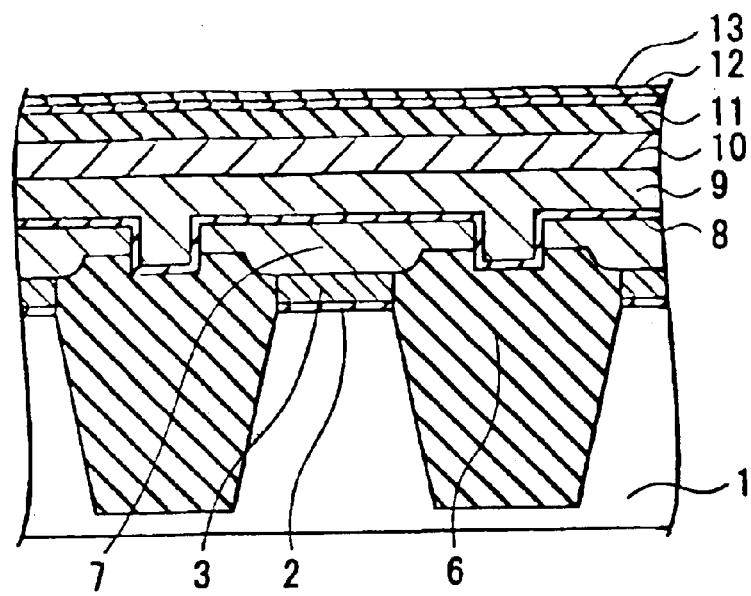
FIG. 18 shows a manufacturing step of the non-volatile memory device associated with the first embodiment of the present invention, and the manufacturing step is subsequent to FIG. 17.
Figure 18B:
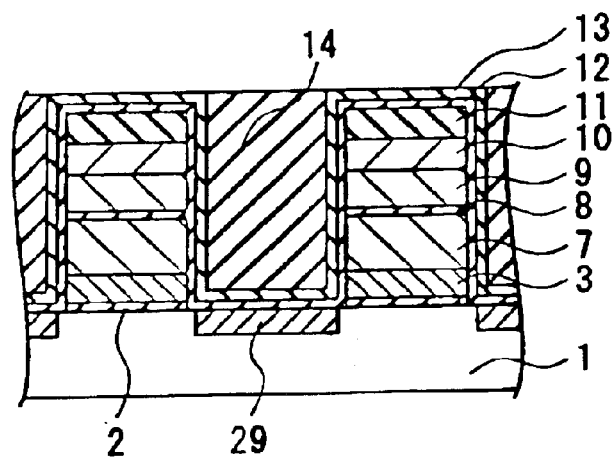
Figure 18C:
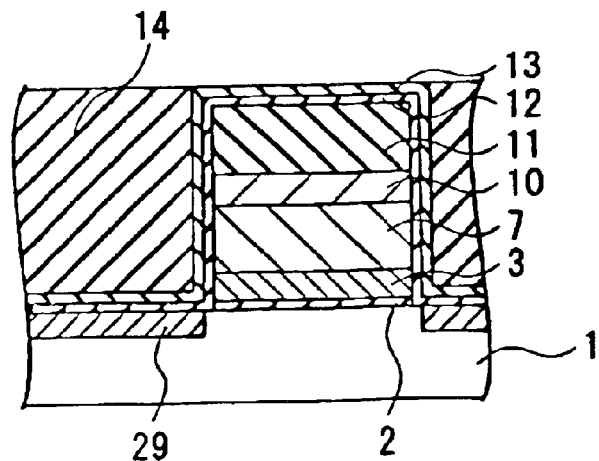

As show in FIG. 18, portion of the insulating layer 14 (the first insulating layer 14a and the second insulating layer 14b) is flattened so as to expose an upper surface of the silicon nitride layer 13 formed on the gate electrode structure by using a CMP method.

Figure 19A:
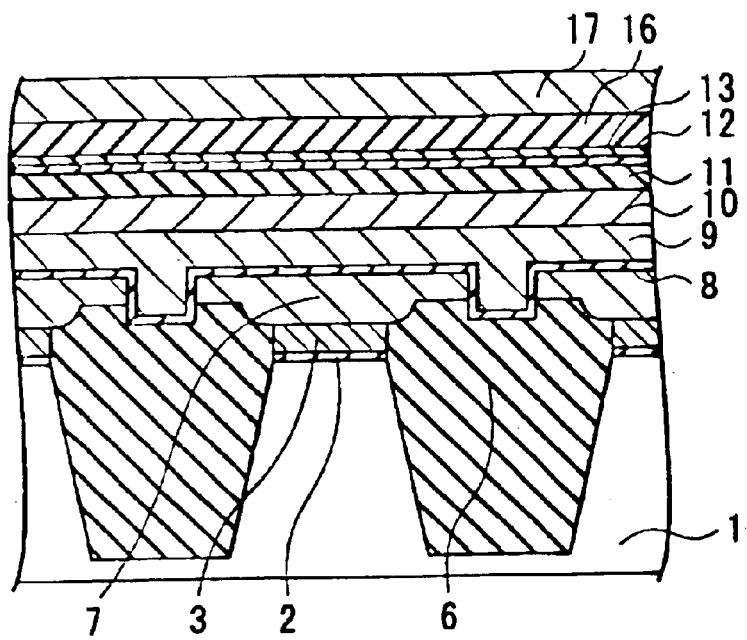
FIG. 19 shows a manufacturing step of the non-volatile memory device associated with the first embodiment of the present invention, and the manufacturing step is subsequent to FIG. 18.
Figure 19B:
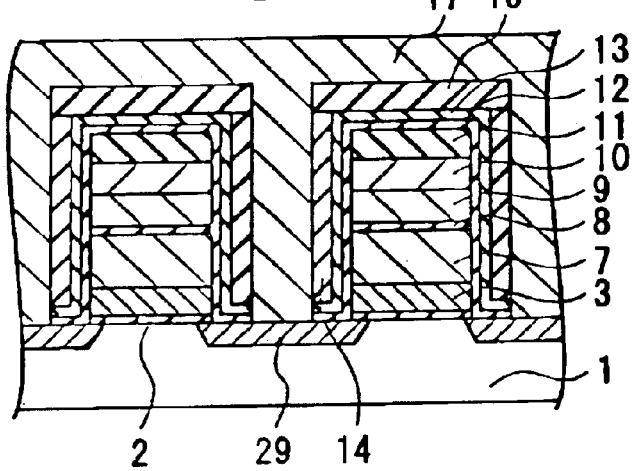
Figure 19C:
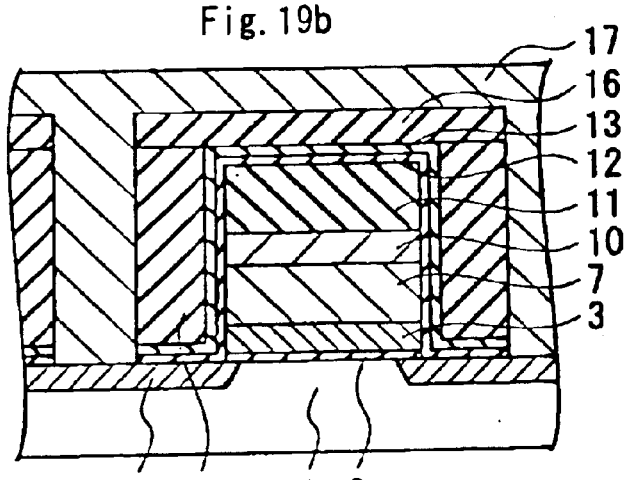

As shown in FIG. 19, a silicon oxide layer 16 with, for instance, 100 nm in thickness is then formed on the silicon nitride layer 13 and the insulating layer 14. A photo resist layer (not shown) is formed thereon and is patterned into a predetermined pattern by using a photolithography technique. By using a CVD method and using the resist layer patterned as a mask, predetermined portions of the silicon oxide layer 16 and the insulating layer 14 are removed, thereby forming contact holes. After forming the contact holes, the photo resist layer is removed by using a process of O2 plasma, and a process of mixture solution of sulfuric acid and hydrogen peroxide.

And then, by using RIE method and using the silicon oxide layer 16 as a mask, the silicon nitride layer 13 and the gate insulating film 2 that are formed on bottom surfaces of the contact holes are removed so as to expose the semiconductor substrate 1. Resultant formations on side surfaces of the contact holes are then removed by using a process of O2 plasma, and a process of mixture solution of sulfuric acid and hydrogen peroxide. Moreover, a tungsten (W) layer 17 with, for instance, 400 nm in thickness is formed to cover the silicon oxide layer 16 and formed in the contact holes by using a CVD method. The tungsten layer 17 that is formed in the contact holes is used as contacts that are connected to the source or the drain region 29 respectively.

Figure 20A:
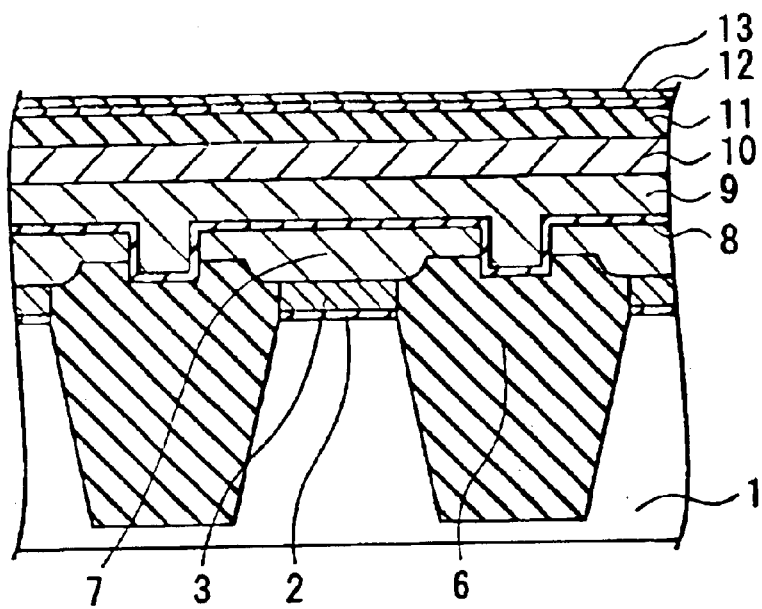
FIG. 20 shows a manufacturing step of the non-volatile memory device associated with the first embodiment of the present invention, and the manufacturing step is subsequent to FIG. 19.
Figure 20B:
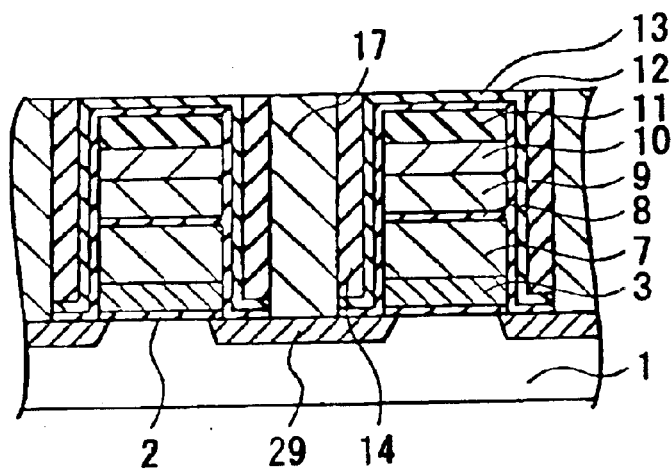
Figure 20C:
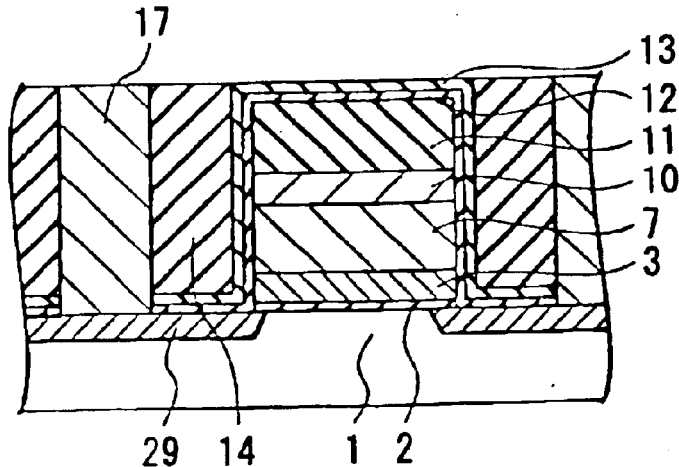
Figure 21A:
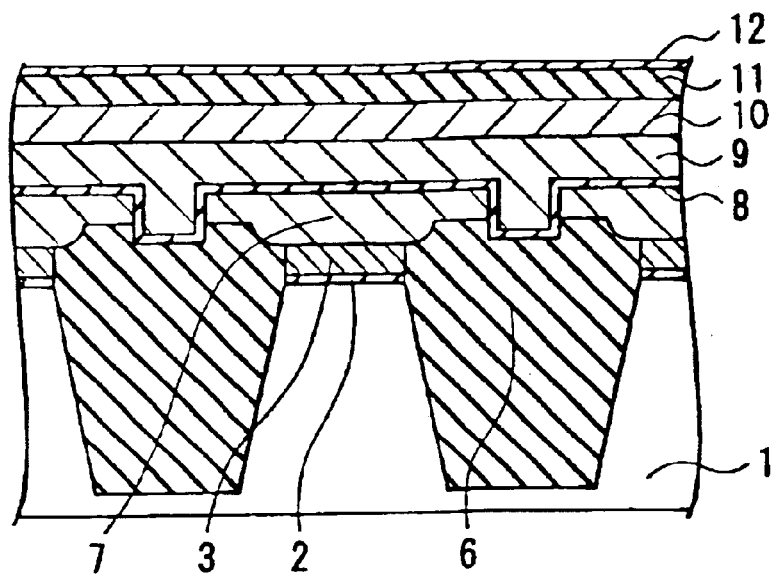
FIG. 21 shows a manufacturing step of the non-volatile memory device associated with the first embodiment of the present invention, and the manufacturing step is subsequent to FIG. 20.
Figure 21B:
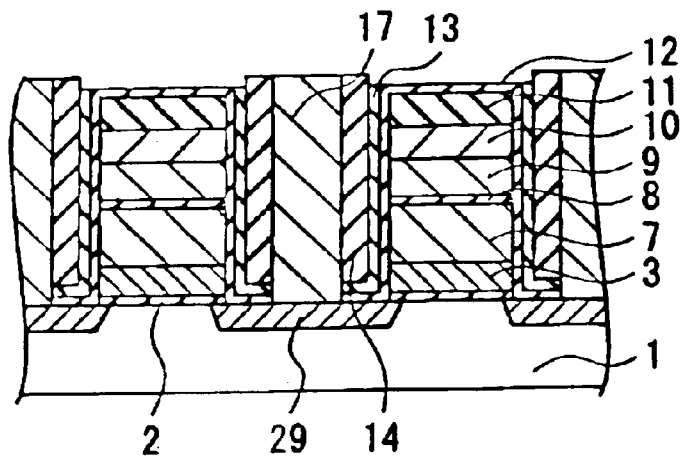
Figure 21C:
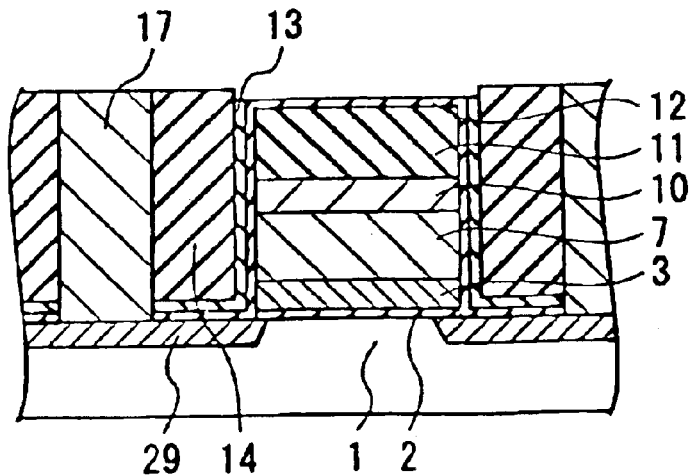

As shown in FIG. 20, the tungsten layer 17 and the silicon oxide layer 16 are flattened so as to expose the upper surfaces of the silicon nitride layer 13 by using a CMP method. As shown in FIG. 21, the exposed silicon nitride layer 13 is removed by using a process of phosphorous acid with, for instance, 160 degrees centigrade and 7 minutes. It is noted that the step of removal of the exposed silicon nitride layer 13 may be achieved by the other wet etching processes.

Figure 22A:
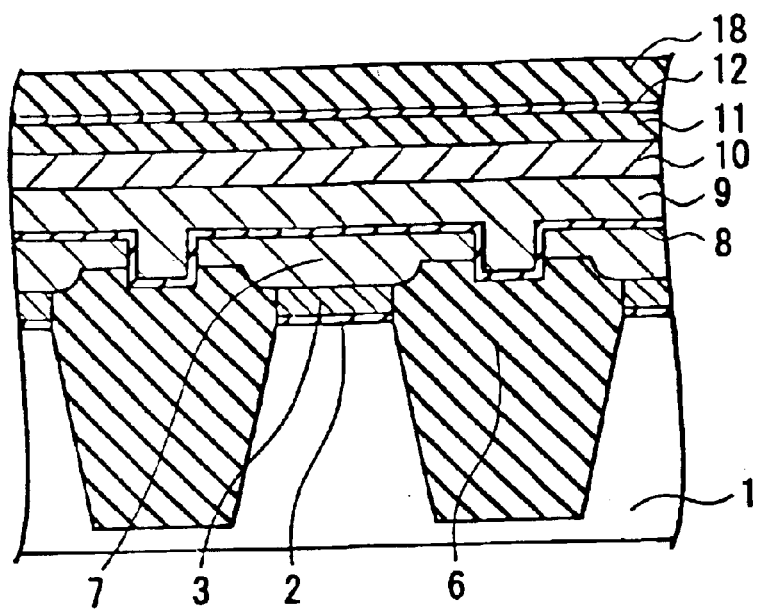
FIG. 22 shows a manufacturing step of the non-volatile memory device associated with the first embodiment of the present invention, and the manufacturing step is subsequent to FIG. 21.
Figure 22B:
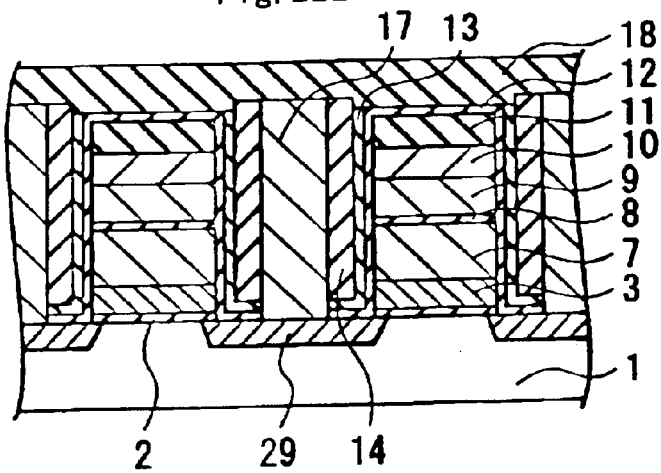
Figure 22C:
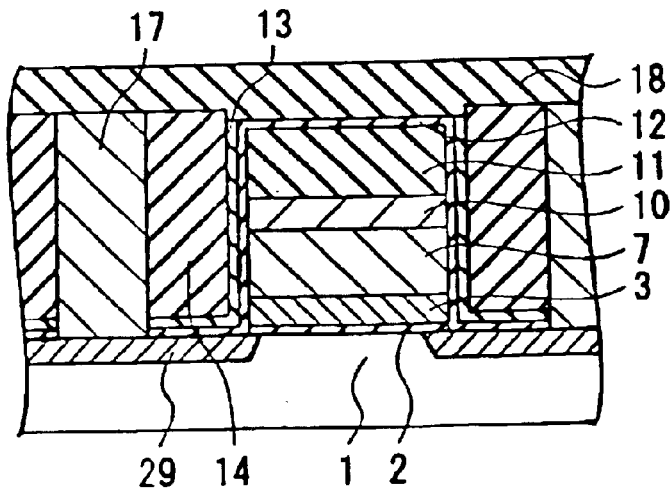
Figure 23A:
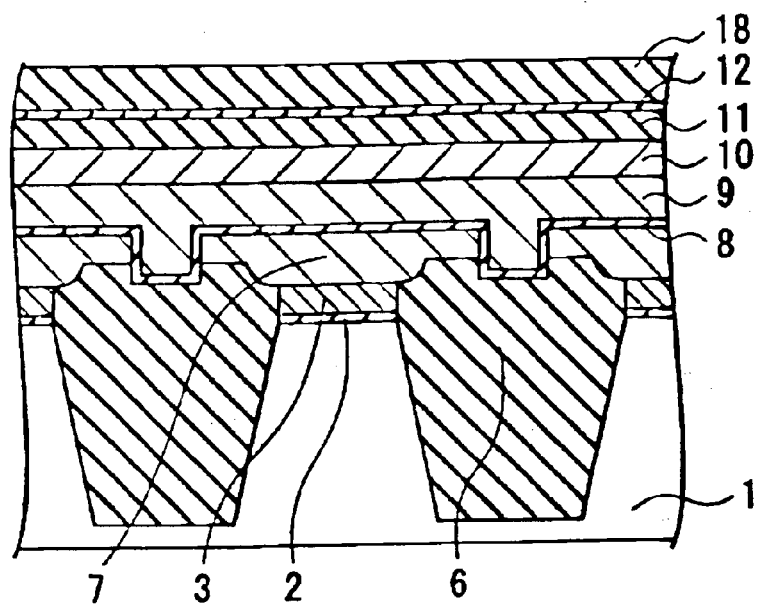
FIG. 23 shows a manufacturing step of the non-volatile memory device associated with the first embodiment of the present invention, and the manufacturing step is subsequent to FIG. 22.
Figure 23B:
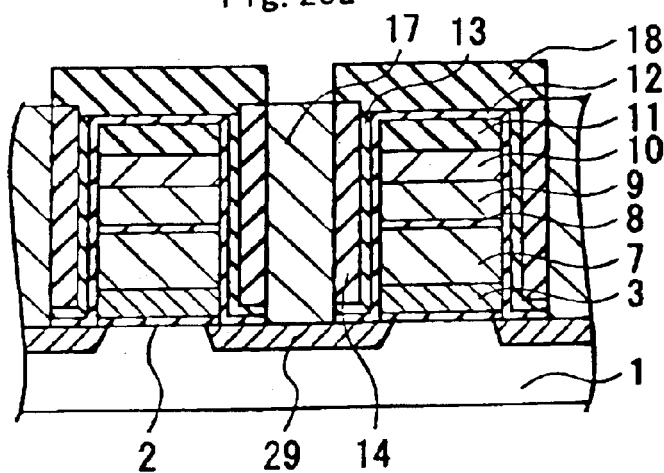
Figure 23C:
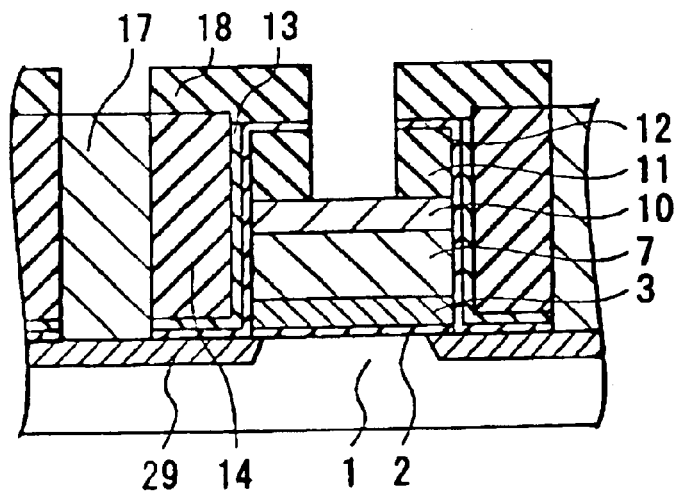

As shown in FIG. 22, portions of a silicon oxide layer 18 with, for instance, 450 nm in thickness is formed by a plasma CVD method. A photo resist layer (not shown) is then formed and patterned into a predetermined patterned by using a photolithography technique. As shown in FIG. 23, portions of the silicon oxide layer 18 are removed, thereby forming second contact holes so as to reach upper surfaces of the tungsten layer 17 and/or the tungsten silicide 10 by using a RIE method and using the predetermined patterned photo resist layer as a mask. Some of the second contact holes which reach the tungsten silicide layer 17 are formed by removing the portions of the silicon oxide layer 18. Also, others of the second contact holes which reach the tungsten silicide layer 10 are formed by removing the portions of the silicon oxide layer 18, 12, and 11. After forming the second contact holes, the photo resist layer is removed by using a process of O2 plasma, and a process of mixture solution of sulfuric acid and hydrogen peroxide.

Figure 24A:
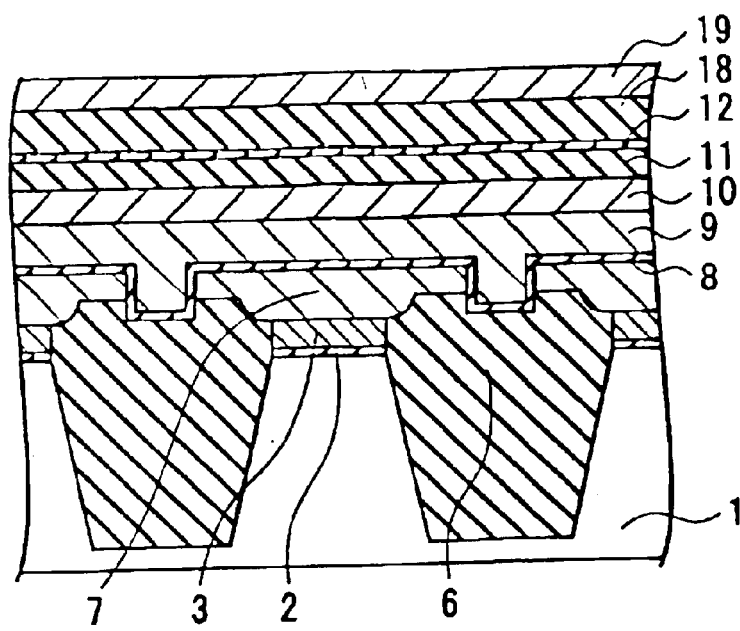
FIG. 24 shows a manufacturing step of the non-volatile memory device associated with the first embodiment of the present invention, and the manufacturing step is subsequent to FIG. 23.
Figure 24B:
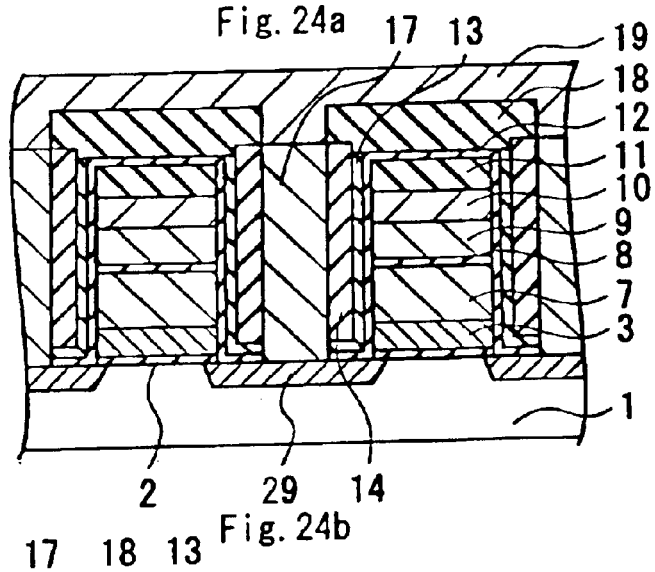
Figure 24C:
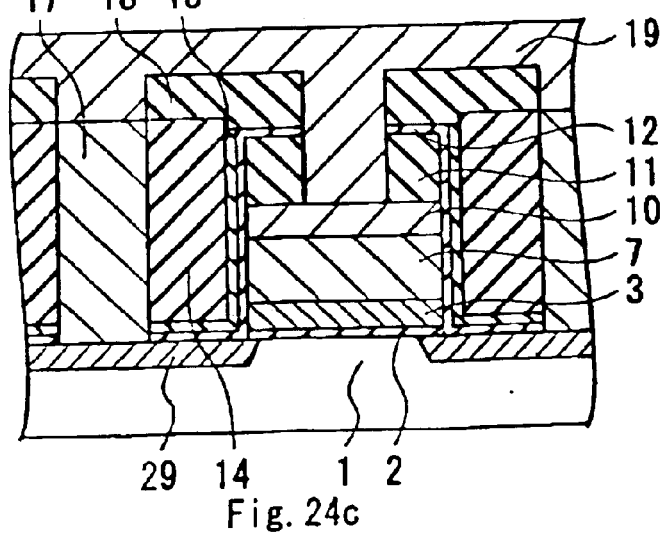
Figure 25A:
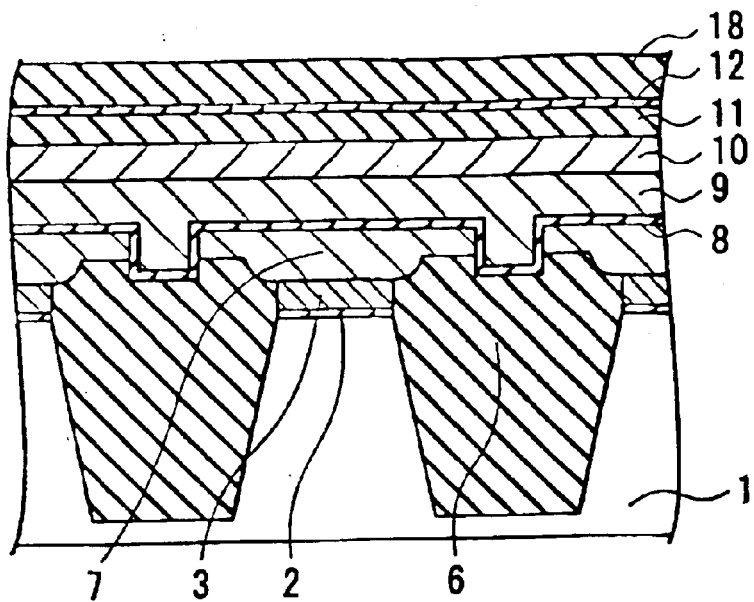
FIG. 25 shows a manufacturing step of the non-volatile memory device associated with the first embodiment of the present invention, and the manufacturing step is subsequent to FIG. 24.
Figure 25B:
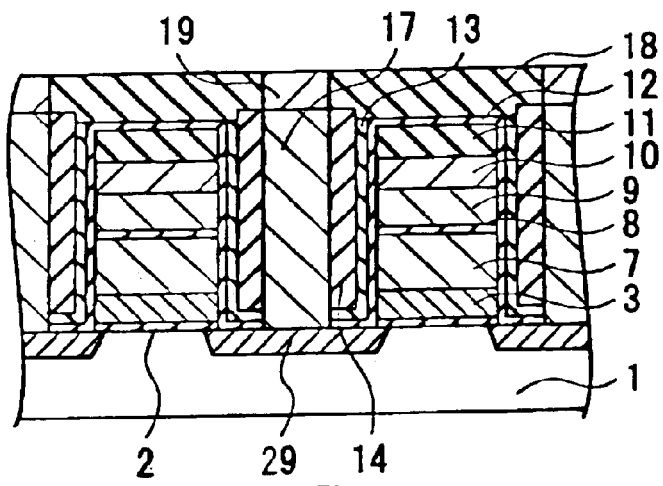
Figure 25C:
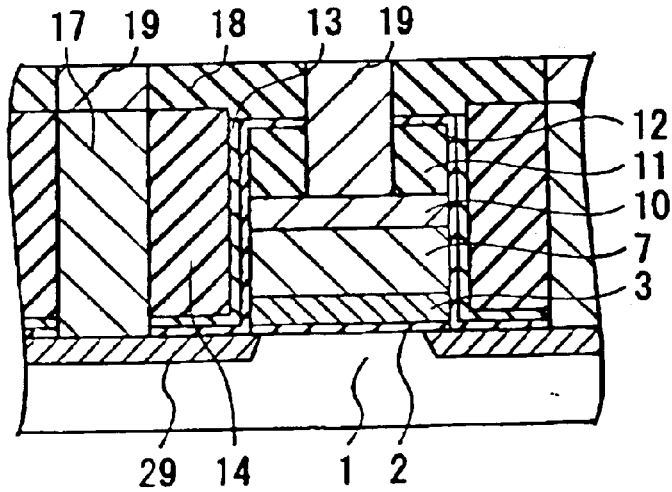

As shown in FIG. 24, a tungsten layer 19 with, for instance, 250 nm in thickness is formed so as to cover a silicon oxide layer 18 and fulfill the second contact holes by using a CVD method. As shown in FIG. 25, the tungsten layer 19 and the silicon oxide layer 18 are flattened until a thickness of the silicon oxide layer 11 becomes adequate. After that, a metal line that is connected to an upper surface of the tungsten layer 19 is formed. However, the manufacturing step of the metal line will be not shown.

Figure 26A:
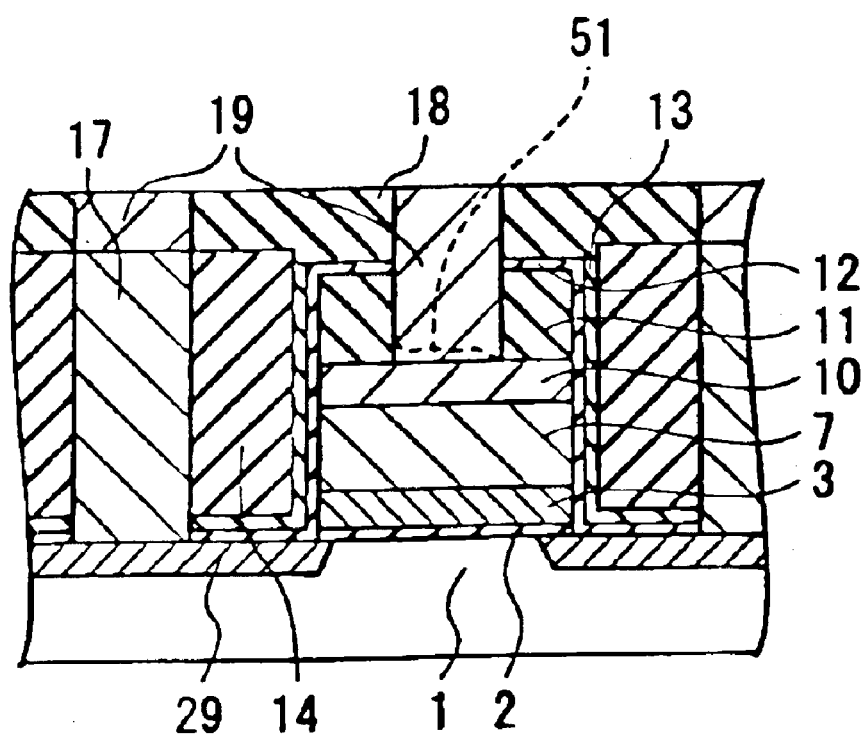
FIG. 26 shows a schematic diagram for explaining about an effect of the first embodiment in the present invention.

As stated above, in this embodiment, the silicon nitride layer 13 that is formed on the upper surface of the gate electrode is removed in advance when the second contact holes are formed. Therefore, some of the silicon nitride layer 51 does not remain in the second contact holes (See FIG. 26a), even if an etching step with a high etching rate for the silicon nitride layer is performed. And also, it does not happen that the tungsten layer 19 is not connected to the tungsten silicide layer 10.

Figure 26B:
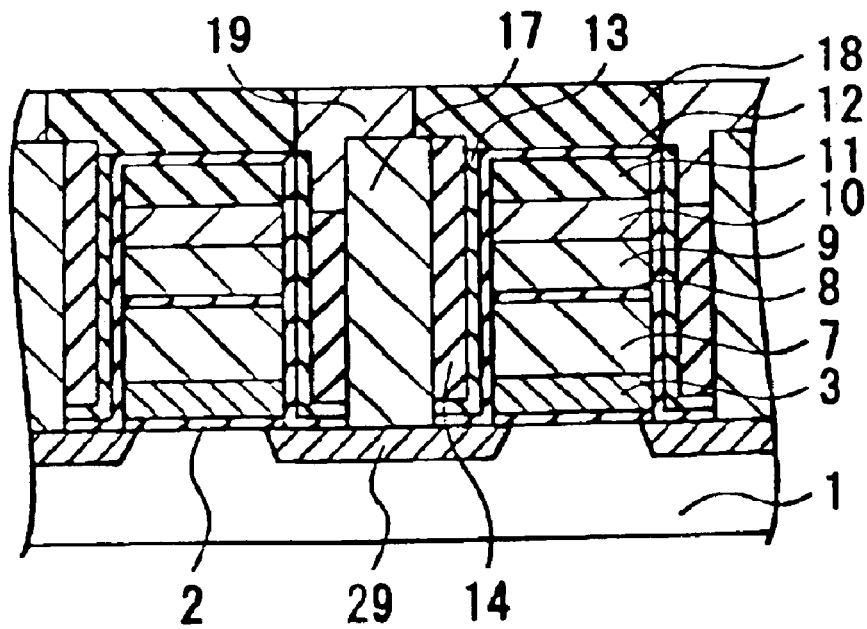

Also, even if a position of the first contact hole is out of a position of the second contact hole, it can be prevented that the tungsten layer 19 is connected to the tungsten silicide layer 10 that is used as the control gate electrode (See FIG. 26b). Because side surfaces of the silicon oxide layer 11 and the tungsten silicide layer 10 that is used as the control gate are covered with the silicon nitride layer 13, and the etching step for forming the second contact holes is performed with a condition of a high etching rate for the silicon nitride layer.

(Second Embodiment)

Figure 27A:
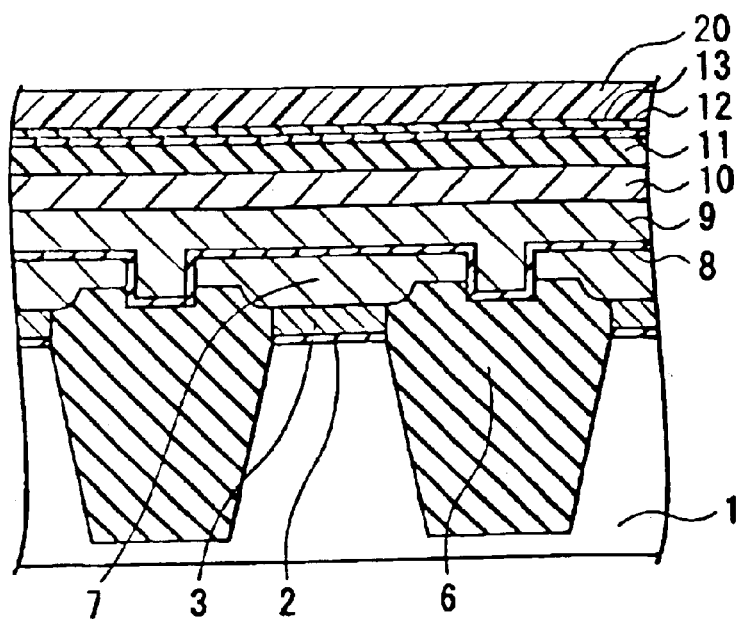
FIG. 27 shows a manufacturing step of the non-volatile memory device associated with the second embodiment of the present invention.
Figure 27B:
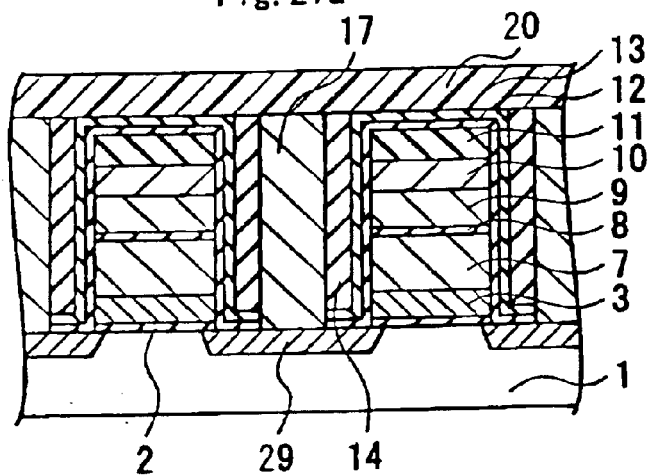
Figure 27C:
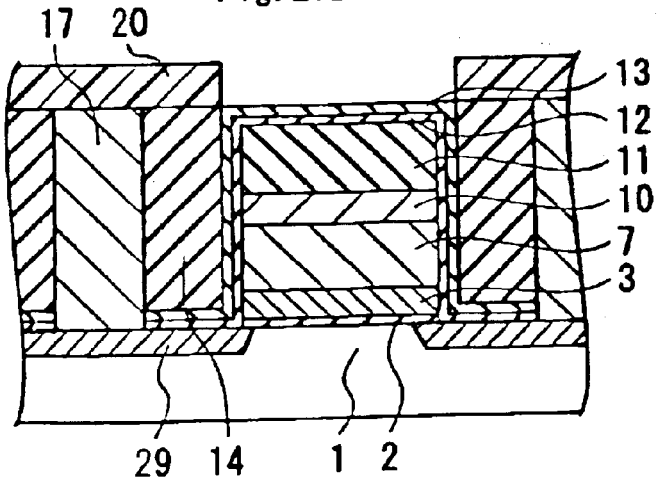
Figure 28A:
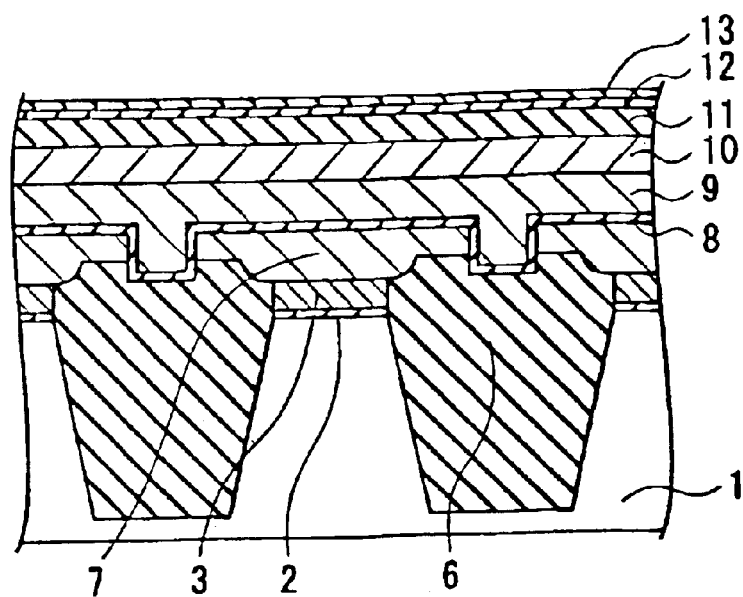
FIG. 28 shows a manufacturing step of the non-volatile memory device associated with the second embodiment of the present invention, and the manufacturing step is subsequent to FIG. 27.
Figure 28B:
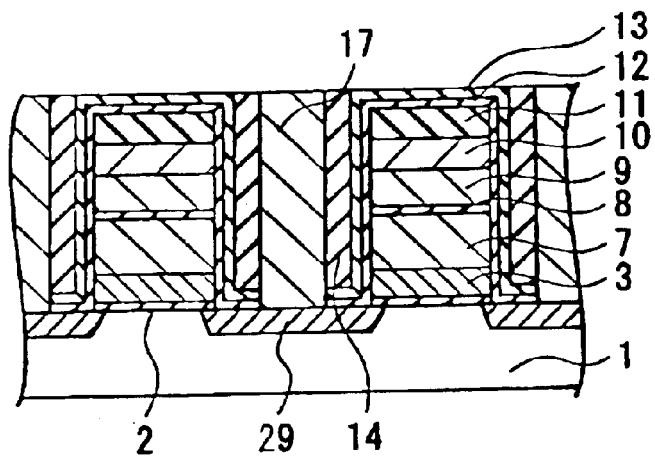
Figure 28C:
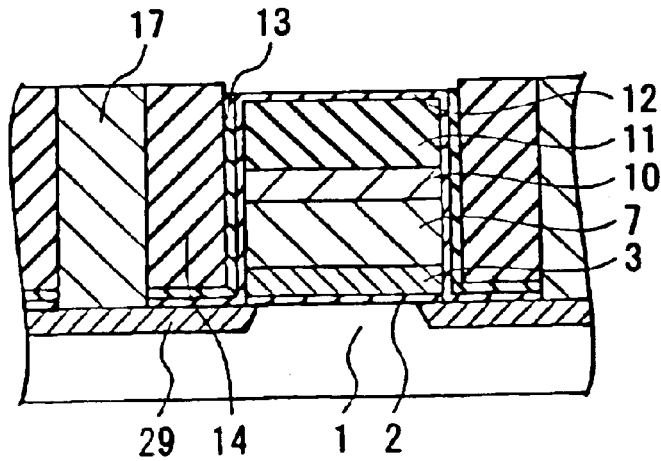

We will explain about a second embodiment of the present invention with reference to FIGS. 27 and 28. FIGS. 27 and 28 show manufacturing steps of a non-volatile semiconductor memory device. In FIGS. 27 and 28, a same reference number will be assigned to a portion in FIGS. 27 and 28 that has explained before. The second embodiment is different from the first embodiment in that a silicon nitride layer 13 formed on a gate electrode in a peripheral circuit region is removed (See FIG. 28c), but the silicon nitride layer 13 formed on a gate electrode in a memory cell region is not removed (See FIG. 28b).

Similarly to the first embodiment, manufacturing steps shown in FIGS. 1 to 20 are performed. Ant then, as shown in FIG. 27, a photo resist layer 20 is formed on the silicon nitride layer 13 and the tungsten silicide layer 17, and processed into a predetermined pattern by using a photo lithography technique. As shown in FIG. 28, portions of the silicon nitride layer 13 are removed by using a RIE method and using the patterned photo resist layer 20 as a mask. After that, the patterned photo resist layer 20 is removed by using a process of O2 plasma, and a process of mixture solution of sulfuric acid and hydrogen peroxide. The same manufacturing steps shown in FIGS. 22 to 25 could be applied to the following steps, but will be omitted.

In this embodiment, the silicon nitride layer 13 that is formed on the upper surface of the gate electrode is removed in advance when the second contact holes are formed. Therefore, the silicon nitride layer 51 does not remain in the second contact holes (See FIG. 26a), even if an etching step with a high etching rate for the silicon nitride layer is performed. And also, it does not happen that the tungsten layer 19 is not connected to the tungsten silicide layer 10.

Also, even if a position of the first contact hole is out of a position of the second contact hole, it can be prevented that the tungsten layer 19 is connected to the tungsten silicide layer 10 that is used as the control gate electrode (See FIG. 26b). Because side surfaces of the silicon oxide layer 11 and the tungsten silicide layer 10 that is used as the control gate are covered with the silicon nitride layer 13, and the etching step for forming the second contact holes is performed with a condition of a high etching rate for the silicon nitride layer.

(Third Embodiment)

Figure 29A:
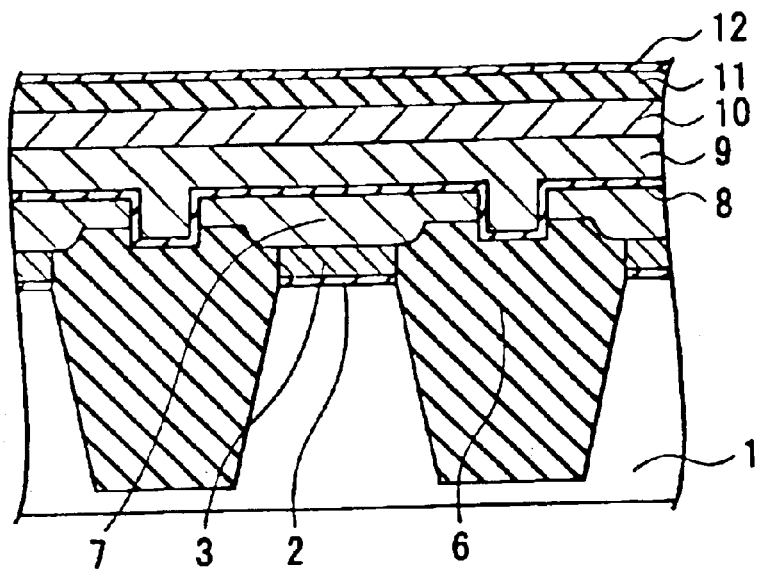
FIG. 29 shows a manufacturing step of the non-volatile memory device associated with the third embodiment of the present invention.
Figure 29B:
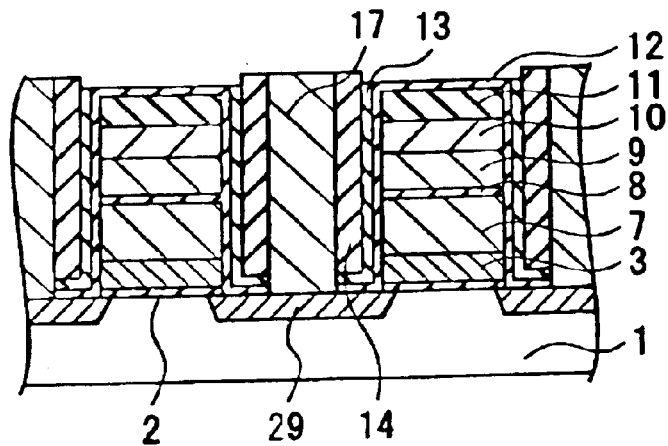
Figure 29C:
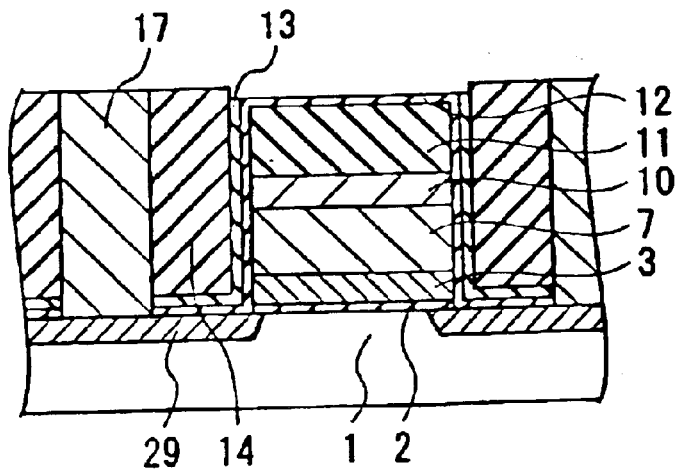

We will explain about a third embodiment in the present invention with reference to FIG. 29. FIG. 29 shows manufacturing step of a non-volatile semiconductor memory device. In FIGS. 29, a same reference number will be assigned to a portion in FIG. 29 that has explained before. In the first embodiment, the silicon nitride layer 12 formed on the memory cell region and the peripheral circuit region is removed by using a wet etching method. However, in the third embodiment, the silicon nitride layer 12 formed on the memory cell region and the peripheral circuit region is removed by using a RIE method.

The manufacturing steps in FIGS. 1 to 20 are performed. Ant then, as shown in FIG. 29, the silicon nitride layer 13 formed on the silicon oxide layer 11 is removed by using a RIE method and using the insulating layer 12 as a mask. The same manufacturing steps shown in FIGS. 22 to 25 could be applied to the following steps, but will be omitted.

In this embodiment, the silicon nitride layer 13 that is formed on the upper surface of the gate electrode is removed in advance when the second contact holes are formed. Therefore, the silicon nitride layer 51 does not remain in the second contact holes (See FIG. 26a), even if an etching step with a high etching rate for the silicon nitride layer is performed. And also, it does not happen that the tungsten layer 19 is not connected to the tungsten silicide layer 10.

Also, even if a position of the first contact hole is out of a position of the second contact hole, it can be prevented that the tungsten layer 19 is connected to the tungsten silicide layer 10 that is used as the control gate electrode (See FIG. 26b). Because side surfaces of the silicon oxide layer 11 and the tungsten silicide layer 10 that is used as the control gate are covered with the silicon nitride layer 13, and the etching step for forming the second contact holes is performed with a condition of a high etching rate for the silicon nitride layer.

(Fourth Embodiment)

Figure 30A:
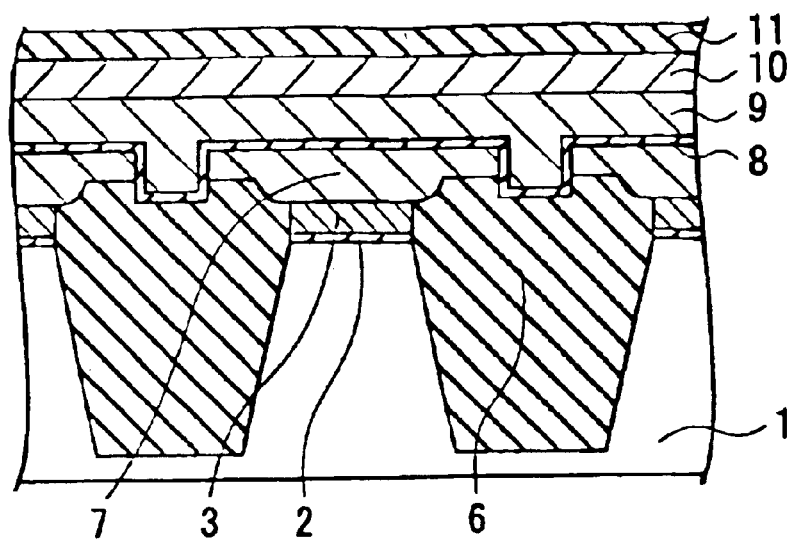
FIG. 30 shows a manufacturing step of the non-volatile memory device associated with the fourth embodiment of the present invention.
Figure 30B:
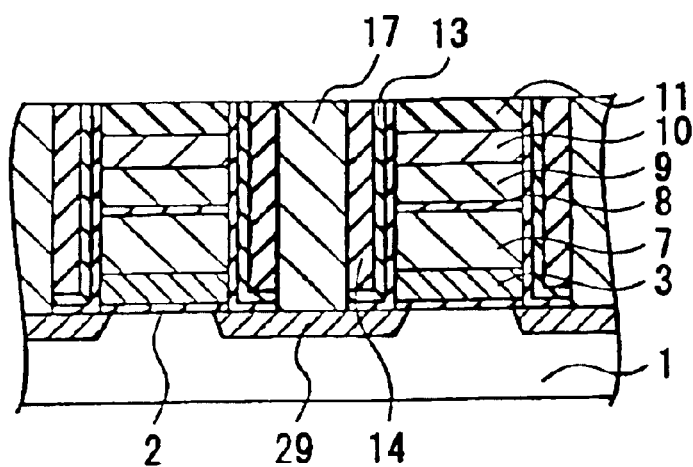
Figure 30C:
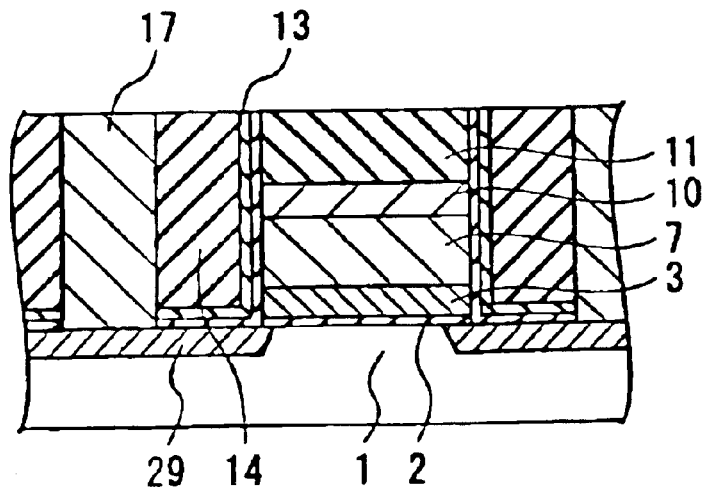

We will explain about a fourth embodiment in the present invention with reference to FIG. 30. FIG. 30 shows manufacturing step of a non-volatile semiconductor memory device. In FIG. 30, a same reference number will be assigned to a portion in FIG. 30 that has explained before. In the first embodiment, the silicon nitride layer 12 formed on the memory cell region and the peripheral circuit region is removed by using a wet etching method. However, in the fourth embodiment, the silicon nitride layer 12 formed on the memory cell region and the peripheral circuit region is removed by using a CMP method.

The manufacturing steps in FIGS. 1 to 19 are performed. Ant then, as shown in FIG. 30, portions of the tungsten layer 17, the silicon oxide layer 16, the silicon nitride layer 13, the insulating layer 14, and the silicon oxide layer 12 are removed so as to expose an upper surface of the silicon oxide layer 11 by using CMP method. The same manufacturing steps shown in FIGS. 22 to 25 could be applied to the following steps, but will be omitted.

In this embodiment, the silicon nitride layer 13 that is formed on the surface of the gate electrode is removed in advance when the second contact holes are formed. Therefore, the silicon nitride layer 51 does not remain in the second contact holes (See FIG. 26a), even if an etching step with a high etching rate for the silicon nitride layer is performed. And also, it does not happen that the tungsten layer 19 is not connected to the tungsten silicide layer 10.

Also, even if a position of the first contact hole is out of a position of the second contact hole, it can be prevented that the tungsten layer 19 is connected to the tungsten silicide layer 10 that is used as the control gate electrode (See FIG. 26b). Because side surfaces of the silicon oxide layer 11 and the tungsten silicide layer 10 that is used as the control gate are covered with the silicon nitride layer 13, and the etching step for forming the second contact holes is performed with a condition of a high etching rate for the silicon nitride layer.

(Fifth Embodiment)

We will explain about a fifth embodiment in the present invention with reference to FIGS. 31 to 37. FIGS. 31 to 37 show manufacturing steps of a non-volatile semiconductor memory device. In FIGS. 31 to 37, a same reference number will be assigned to a portion in FIGS. 31 to 37 that has explained before. The fifth embodiment is different from a manufacturing step order to remove the silicon nitride layer 13 in the first embodiment.

Figure 31A:
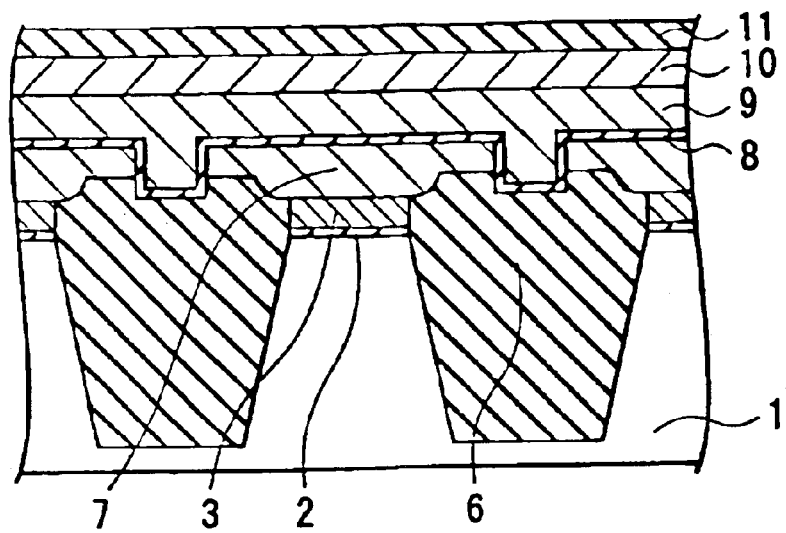
FIG. 31 shows a manufacturing step of the non-volatile memory device associated with the fifth embodiment of the present invention.
Figure 31B:
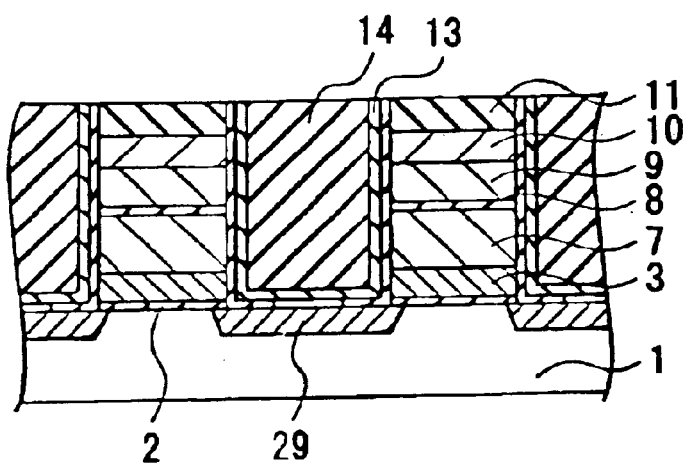
Figure 31C:
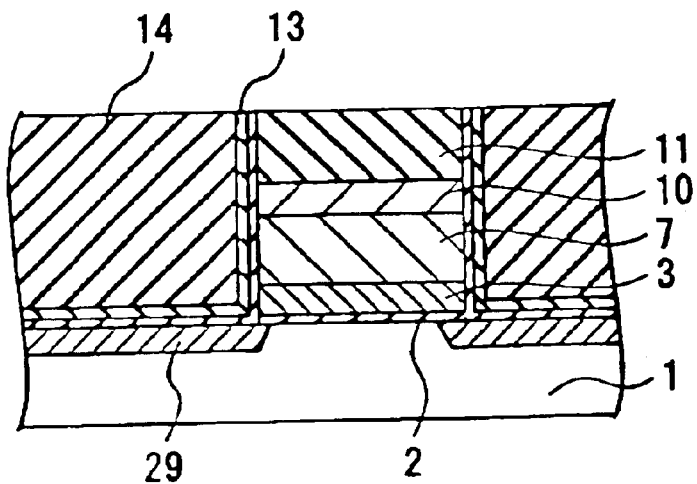

The manufacturing steps in FIGS. 1 to 17 are performed. Ant then, as shown in FIG. 31, portions of the insulating layer 14, the silicon nitride layer 13, and the silicon oxide layer 12 are removed so as to expose an upper surface of the silicon oxide layer 11 by using CMP method. Another method other than the CMP method could be applied. First, the insulating layer 14 is removed so as to expose an upper surface of the silicon nitride layer 13 by using a CMP method. After that, the exposed silicon nitride layer 13 is removed by using a wet etching (for example, phosphorous acid, 160 degrees centigrade, and 7 minutes). Secondly, the insulating layer 14 is removed so as to expose an upper surface of the silicon nitride layer 13 by using a CMP method. After that, a photo resist layer with a predetermined pattern is formed thereon. The exposed silicon nitride layer 13 is removed by using a RIE method and using the photo resist layer with a predetermined pattern as a mask. The photo resist layer with a predetermined pattern is then removed by using a process of O2 plasma, and a process of mixture solution of sulfuric acid and hydrogen peroxide. Thirdly, the insulating layer 14 is removed so as to expose an upper surface of the silicon nitride layer 13 by using a CMP method. After that, the exposed silicon nitride layer 13 is removed by using a RIE method and using the insulating layer 14 as a mask.

Figure 32A:
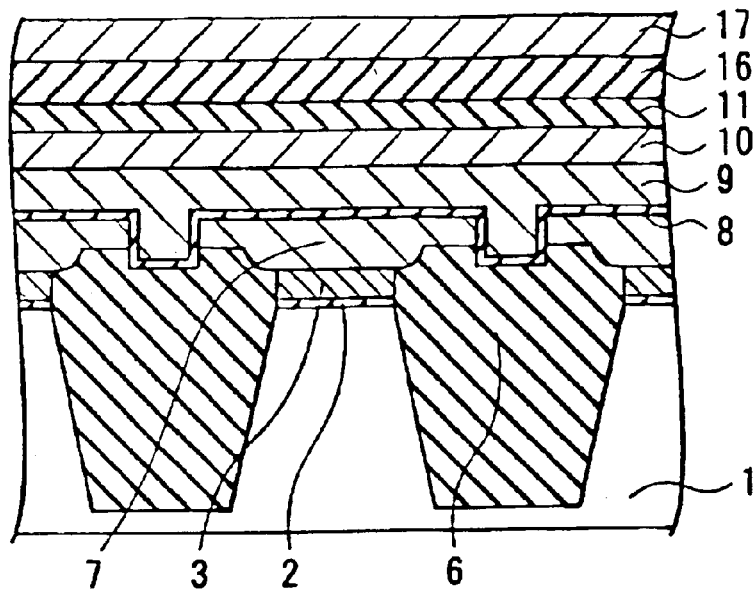
FIG. 32 shows a manufacturing step of the non-volatile memory device associated with the fifth embodiment of the present invention, and the manufacturing step is subsequent to FIG. 31.
Figure 32B:
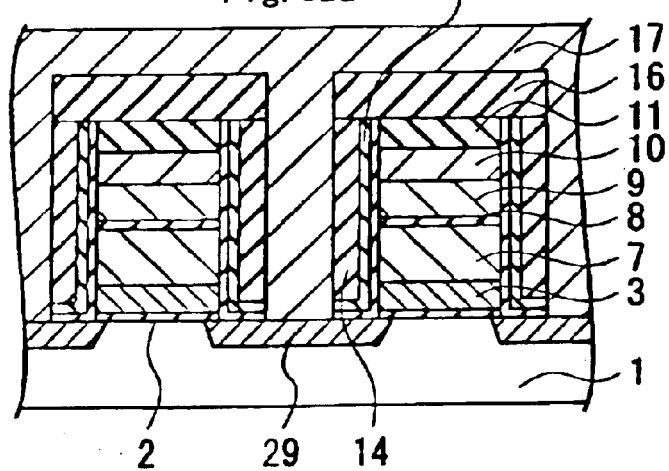
Figure 32C:
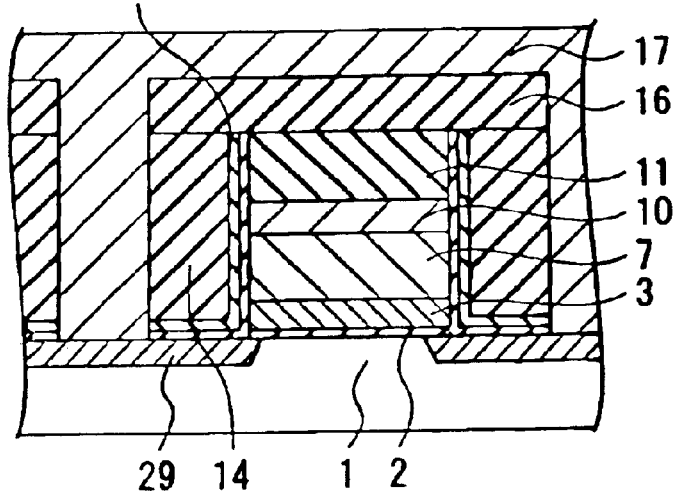

As shown in FIG. 32, a silicon oxide layer 16 with, for instance, 100 nm in thickness is formed on the silicon oxide layer 11. A photo resist layer (not shown) with a predetermined pattern is then formed on the silicon oxide layer 16. The silicon oxide layer 16 and the insulating layer 14 are removed by using a RIE method and using the photo resist layer with the predetermined pattern as a mask, thereby forming contact holes. After that, the photo resist layer with a predetermined pattern is then removed by using a process of O2 plasma, and a process of mixture solution of sulfuric acid and hydrogen peroxide.

Portions of the silicon nitride layer 13 and the gate insulating film 2 that are formed on a bottom of the contact hole are removed so as to expose a surface of the semiconductor substrate 1 by using a RIE method and using the patterned silicon oxide layer 16 as a mask. Residuals on a sidewall of the contact hole are removed by using a process of O2 plasma, and a process of mixture solution of sulfric acid and hydrogen peroxide. A tungsten layer 17 with, for instance, 400 nm in thickness is formed so as to cover the silicon oxide layer 16 and fulfill the contact holes by using a CVD method. The tungsten layer 17 that is formed in the contact holes, as shown in FIG. 32, is used as contacts connected to a source and a drain electrodes (a source and a drain regions 29) of a MOS transistor.

Figure 33A:
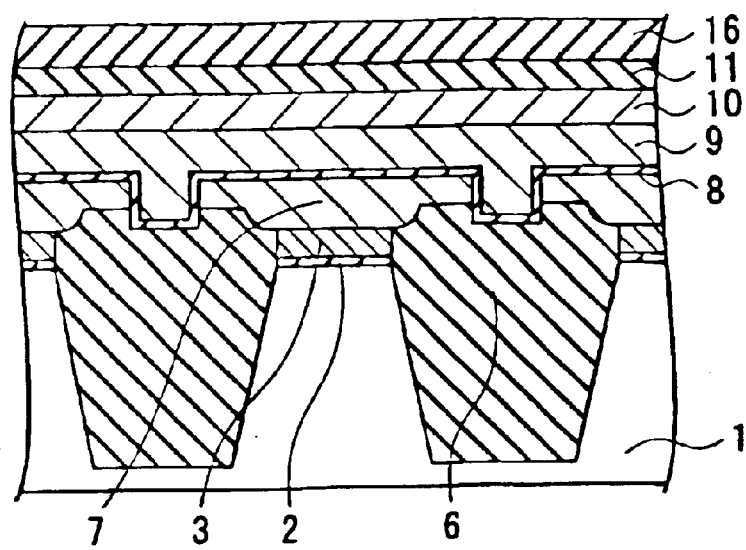
FIG. 33 shows a manufacturing step of the non-volatile memory device associated with the fifth embodiment of the present invention, and the manufacturing step is subsequent to FIG. 32.
Figure 33B:
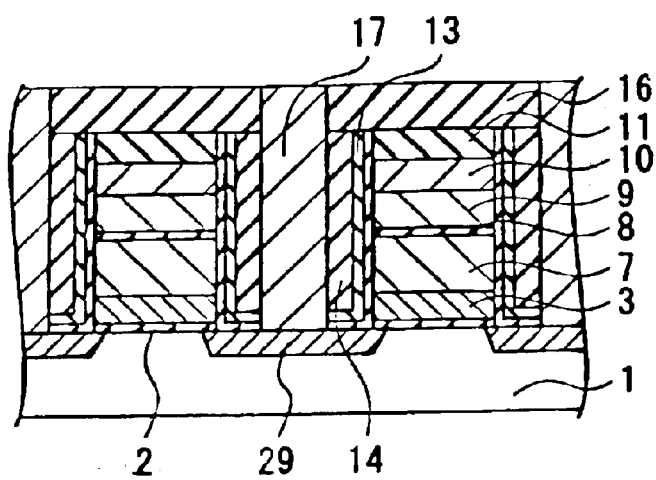
Figure 33C:
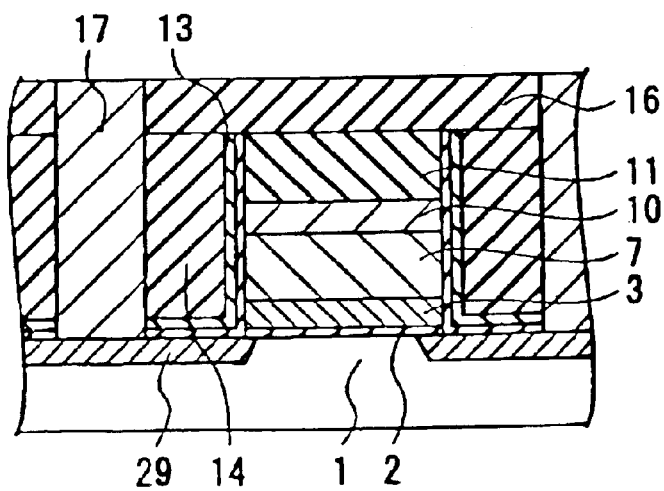
Figure 34A:
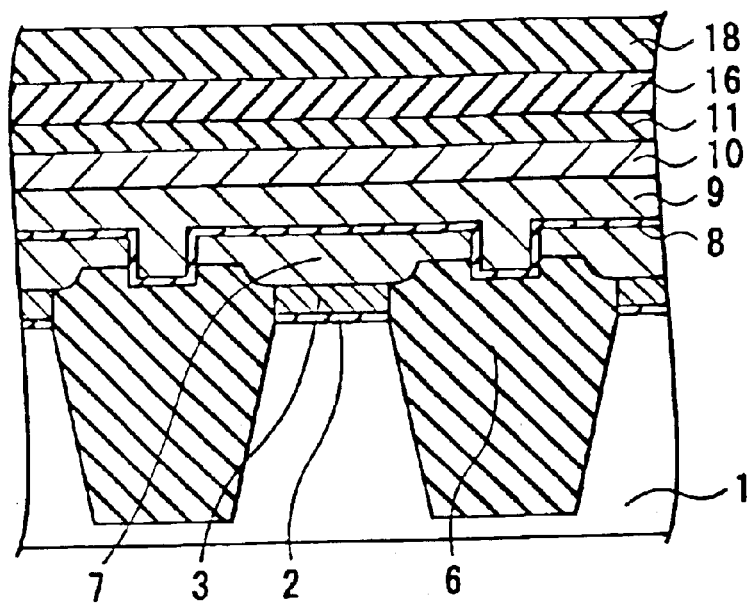
FIG. 34 shows a manufacturing step of the non-volatile memory device associated with the fifth embodiment of the present invention, and the manufacturing step is subsequent to FIG. 33.
Figure 34B:
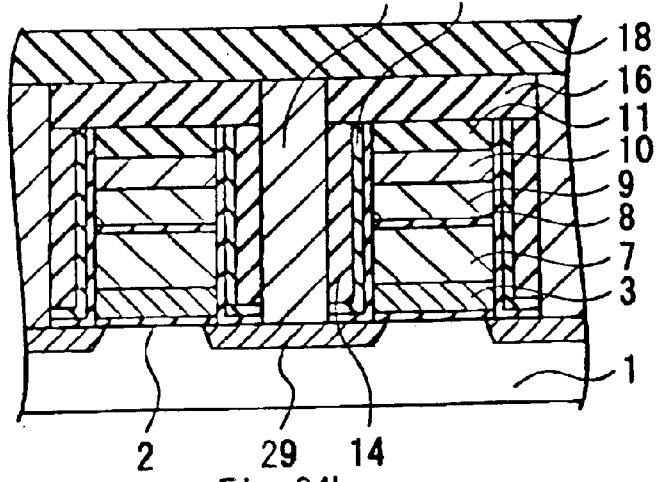
Figure 34C:
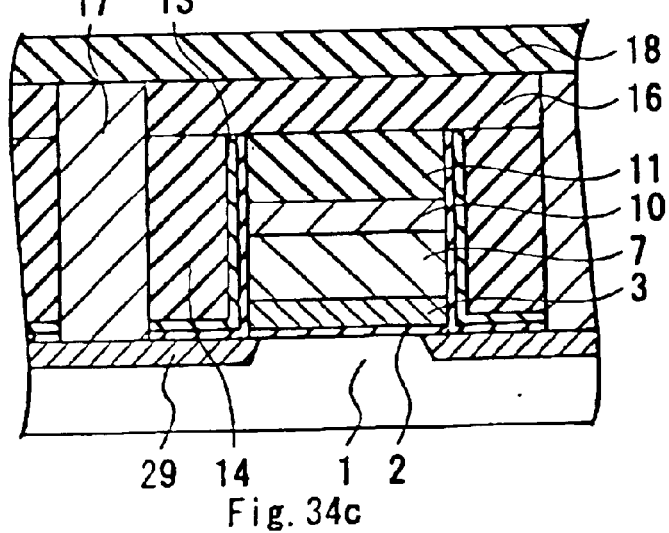
Figure 35A:
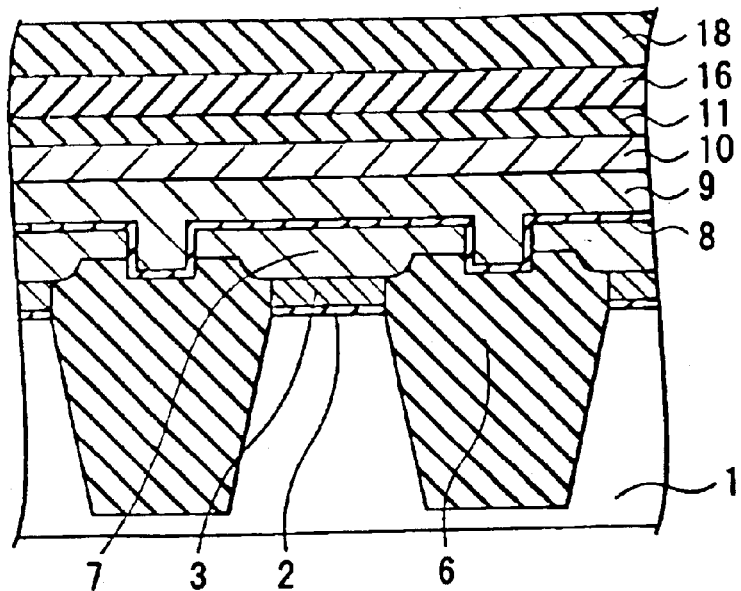
FIG. 35 shows a manufacturing step of the non-volatile memory device associated with the fifth embodiment of the present invention, and the manufacturing step is subsequent to FIG. 34.
Figure 35B:
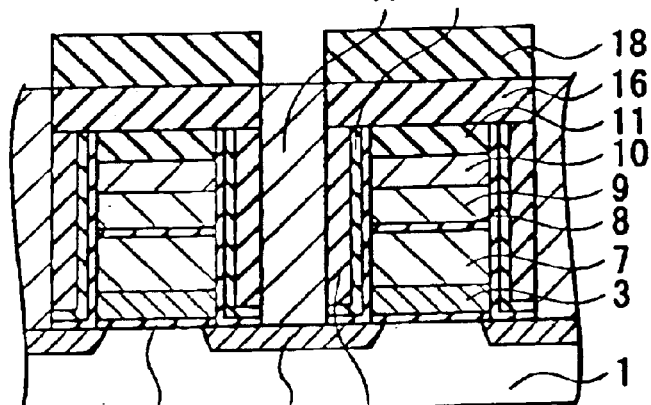
Figure 35C:
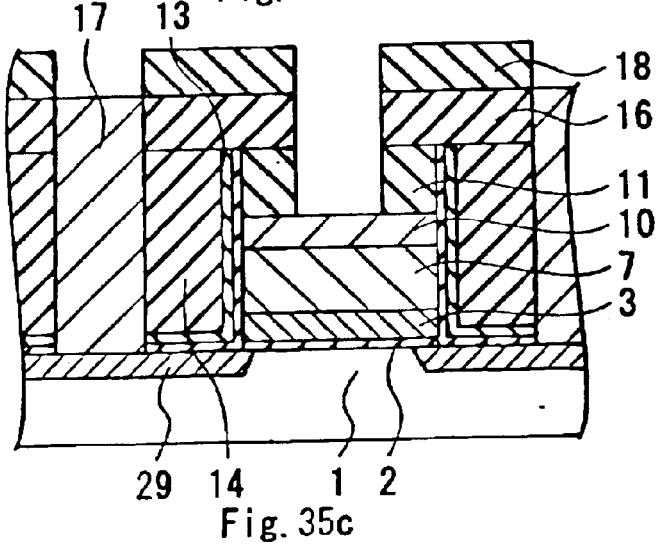

As shown in FIG. 33, Portions of the tungsten layer 17 are removed and flatted so as to expose a surface of the silicon oxide layer 16 by using a CMP method. As shown in FIG. 34, a silicon oxide layer 18 with, for instance, 450 nm in thickness is formed on an entire surface by using a plasma CVD method. As shown in FIG. 35, a photo resist layer (not shown) is formed and processed into a predetermined pattern by using a photolithography technique. By using a RIE method, second contact holes to reach the tungsten layer 17 in the memory cell region (See FIG. 35*b*) and the tungsten silicide layer 10 in the peripheral region (See FIG. 35*c*) are formed. The second contact holes which reach the tungsten layer 17 (See FIG. 35*b*) are formed by removing portions of the silicon oxide layer 18. The second contact holes that reach the tungsten silicide layer 10 (See FIG. 35*c*) are formed by removing portions of the silicon oxide layers 18, 16, and 11. After forming the second contact holes, the resist layer is also removed by using a process of O2 plasma, and a process of mixture solution of sulfuric acid and hydrogen peroxide.

Figure 36A:
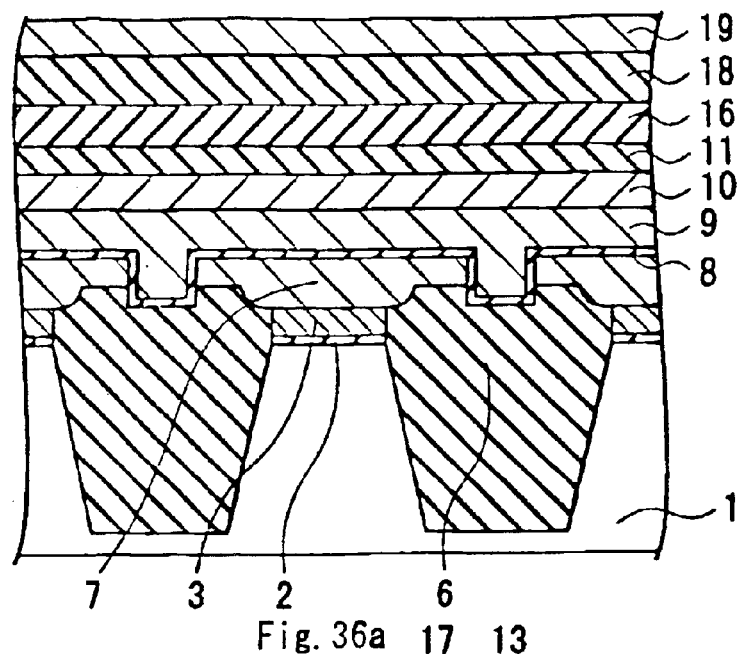
FIG. 36 shows a manufacturing step of the non-volatile memory device associated with the fifth embodiment of the present invention, and the manufacturing step is subsequent to FIG. 35.
Figure 36B:
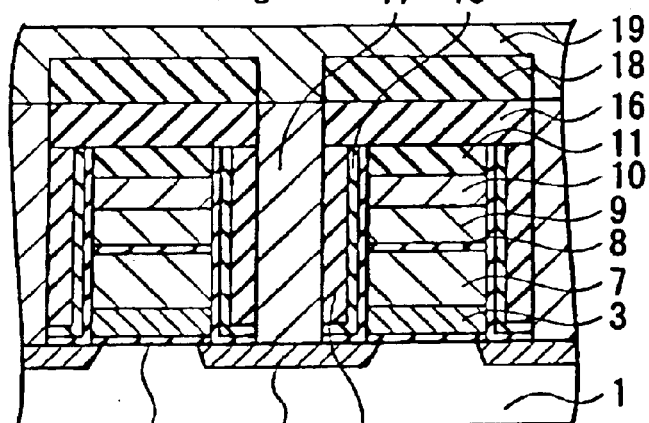
Figure 36C:
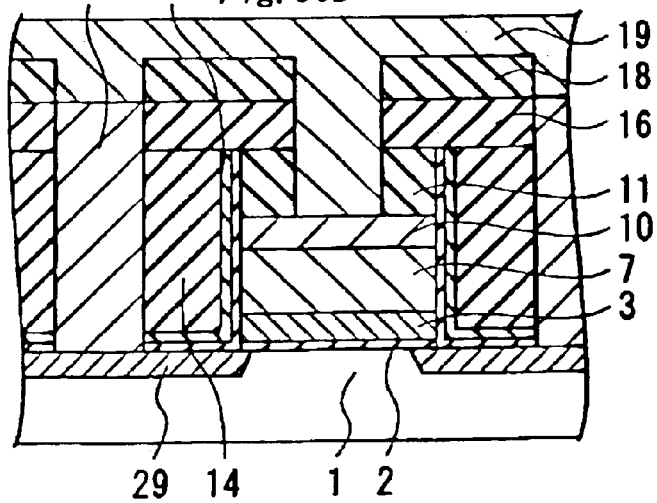
Figure 37A:
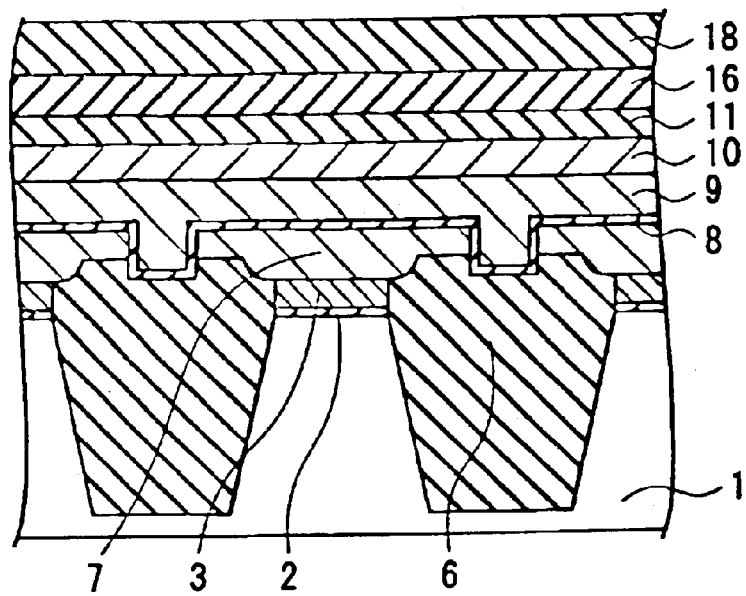
FIG. 37 shows a manufacturing step of the non-volatile memory device associated with the fifth embodiment of the present invention, and the manufacturing step is subsequent to FIG. 36.

As show in FIG. 36, the tungsten layer 19 with, for instance, 250 nm in thickness is formed so as to cover the silicon oxide layer 18 and fulfill the second contact holes by using a CVD method. As shown in FIG. 37, the tungsten layer 19 and the silicon oxide layer 18 are also removed and flattened so as to make the silicon oxide layer 18 become an adequate thickness from a top surface thereof, for instance, 395 nm in thickness by using a CMP method. Although following manufacturing steps are not shown, line patterns to be connected to the tungsten layer 19 may be formed.

As explained before, in this embodiment, the silicon nitride layer 13 that is formed on the upper surface of the gate electrode is removed in advance when the second contact holes are formed. Therefore, the silicon nitride layer 51 does not remain in the second contact holes (See FIG. 26*a*), even if an etching step with a high etching rate for the silicon nitride layer is performed. And also, it does not happen that the tungsten layer 19 is not connected to the tungsten silicide layer 10.

Also, even if a position of the first contact hole is out of a position of the second contact hole, it can be prevented that the tungsten layer 19 is connected to the tungsten silicide layer 10 that is used as the control gate electrode (See FIG. 26*b*). Because side surfaces of the silicon oxide layer 11 and the tungsten silicide layer 10 that is used as the control gate are covered with the silicon nitride layer 13, and the etching step for forming the second contact holes is performed with a condition of a high etching rate for the silicon nitride layer.

Figure 37B:
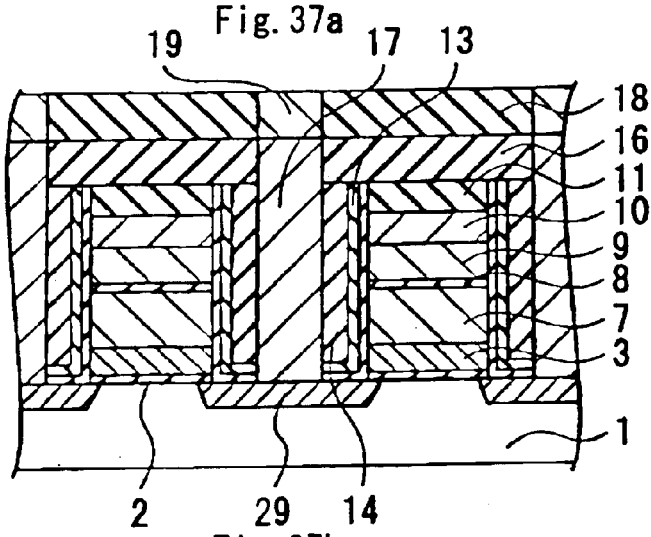
Figure 37C:
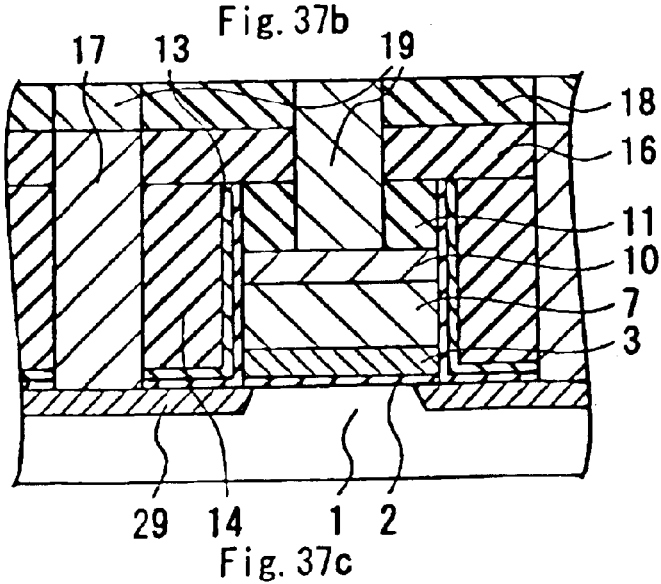

It should be noted that in the peripheral region (See FIG. 37*c*), the tungsten silicide layer 10 and the tungsten layer 19 are used as a gate electrode and a conductive contact respectively. Also, the silicon oxide layer 11 is used as a first silicon oxide layer region. The silicon oxide layers 16 and 18 are used as second silicon oxide layer regions. In FIG. 37*b*, the tungsten silicide layer 10 is used as a control gate. The silicon oxide layer 11 is also used as a third silicon oxide layer region. The tungsten layer 17 and 19 are used as second contacts.

In the embodiments stated before, a STI (Shallow Trench Isolation) is formed after the first gate insulating film is formed. However, it could not be limited to the manufacturing steps, that is, the first gate insulating film could be formed after forming a STI (Shallow Trench Isolation). And also, in each of the embodiments, a nonvolatile semiconductor memory device including a floating gate is stated. However, the other type of a nonvolatile semiconductor memory device is applicable to the embodiments of the present invention.

Figure 44:
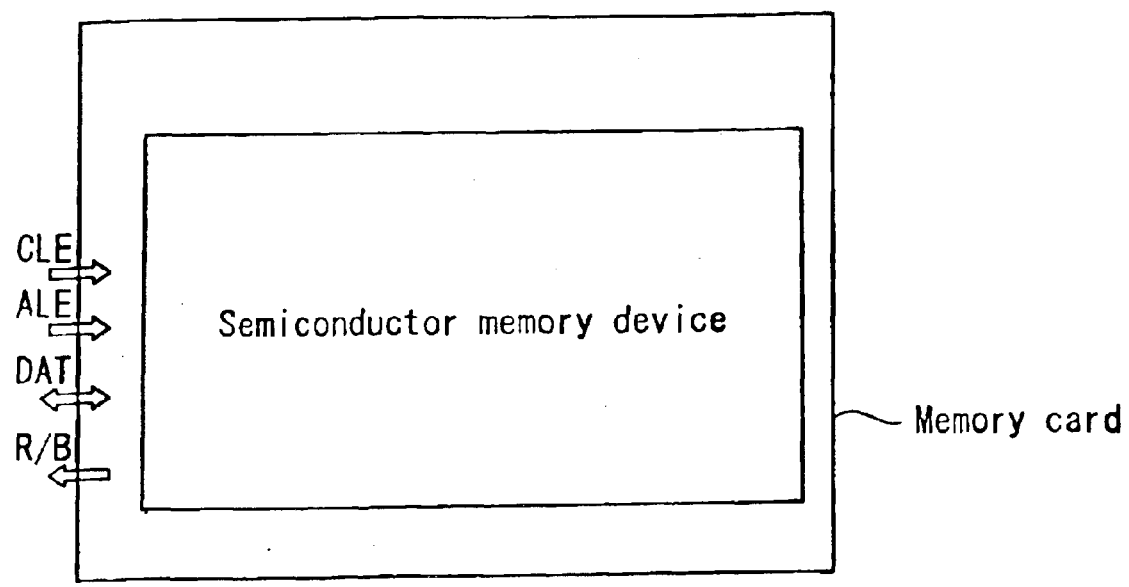
FIG. 44 shows a diagram of a memory card in which a semiconductor memory device is arranged.

We will explain about applications having an above-mentioned semiconductor memory device. A memory card having the above mentioned semiconductor memory device is shown in FIG. 44. As shown in FIG. 44, the semiconductor memory device receives/outputs predetermined signals and data from/to an external device (not shown).

A signal line (DAT), a command line enable signal line (CLE), an address line enable signal line (ALE) and a ready/busy signal line (R/B) are connected to the memory card having the above mentioned semiconductor memory device. The signal line (DAT) transfers data, address or command signals. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not.

Figure 45:
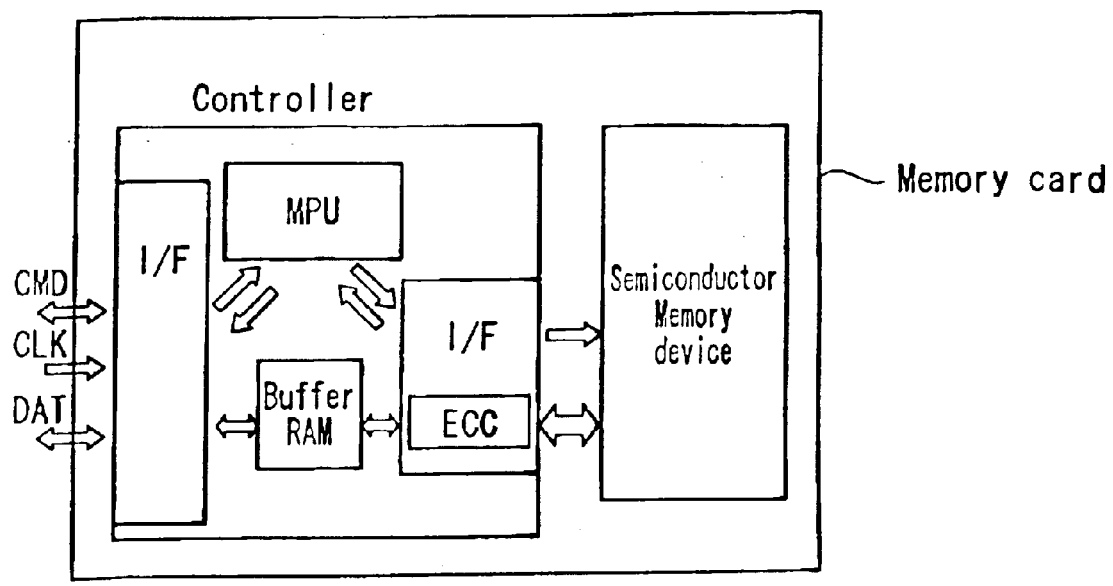
FIG. 45 shows a diagram of a memory card in which a semiconductor memory device and a controller are arranged.

Another example of a memory card is shown in FIG. 45. The memory card shown in FIG. 45 differs from the memory card presented in FIG. 44 in that the memory card includes a controller which controls the semiconductor memory device and receives/transfers predetermined signals from/to an external device (not shown).

The controller includes an interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores data temporarily. The error correction code unit generates an error correction code. And a command signal line (CMD), a clock signal line (CLK) and a signal line (DAT) are connected to the memory card.

Although we explain about the memory cards as shown above, the number of the control signal lines, bit width of the signal line (DAT) and a circuit construction of the controller could be modified suitably.

Figure 46:
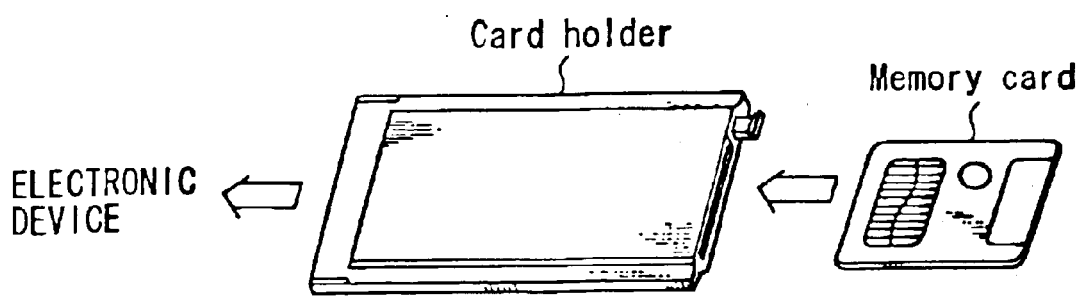
FIG. 46 shows a diagram of a card holder to which a memory card is inserted.

Another application is shown in FIG. 46. A memory card holder to which the memory card is inserted, is shown in FIG. 46. And the card holder is connected to electronic device (not shown). The card holder may have a part of the functions of the controller.

Figure 47:
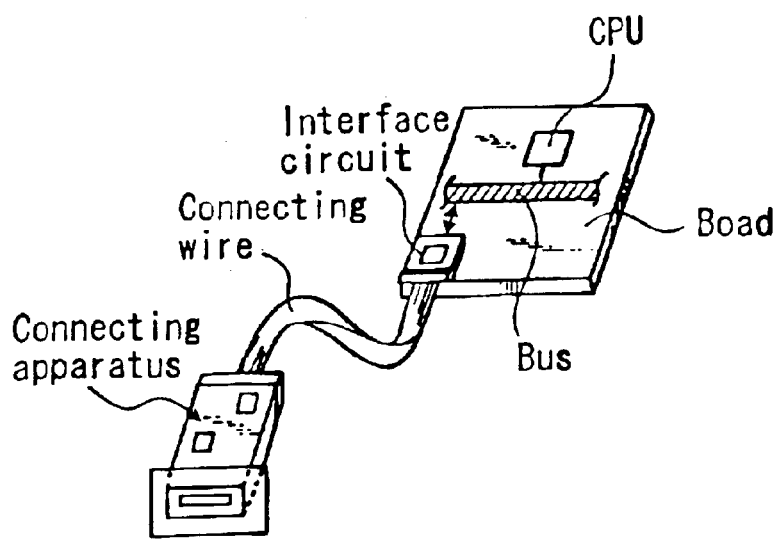
FIG. 47 shows a diagram of a connecting apparatus, a board, and a connecting wire.

Another application is shown in FIG. 47. As shown in FIG. 47, the memory card or the card holder to which the memory card is inserted, is inserted to a connecting apparatus. The connecting apparatus is connected to a board via a connecting wire and an interface circuit. The board has a CPU (Central Processing Unit) and a bus.

Figure 48:
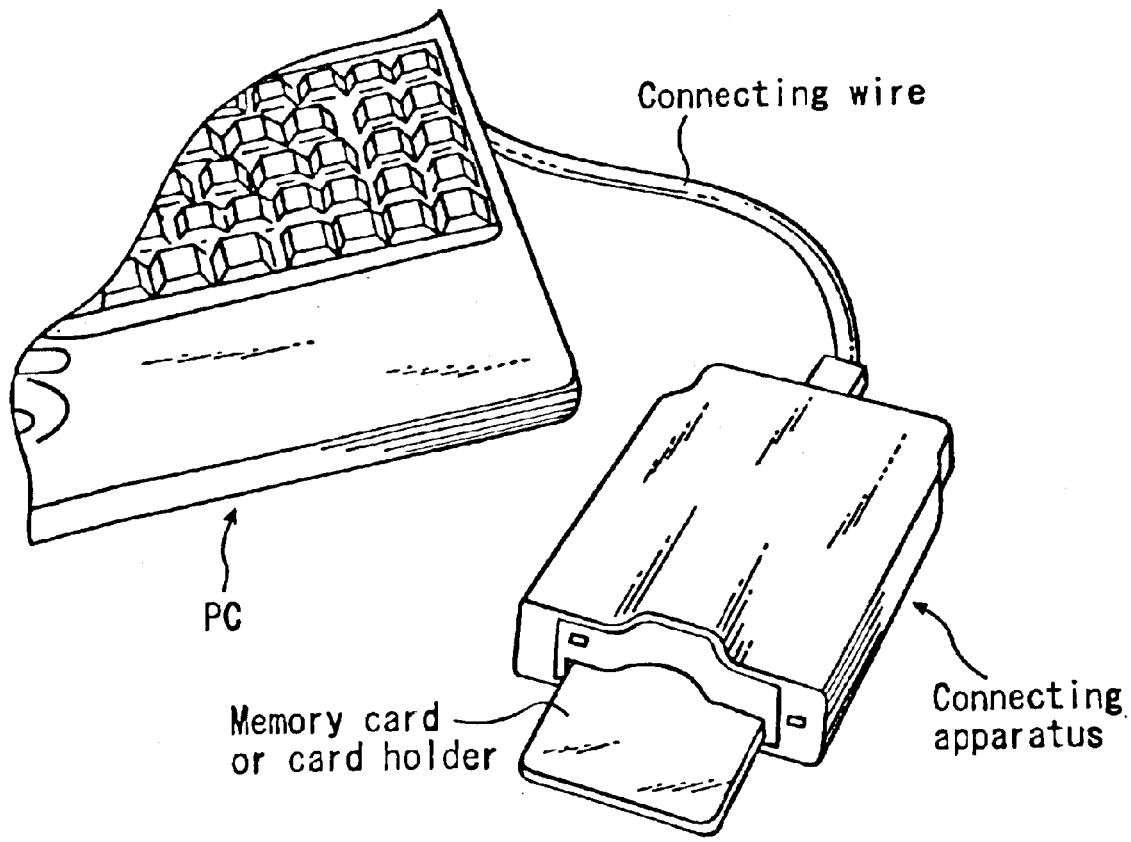
FIG. 48 shows a diagram of a PC, a connecting apparatus, and a connecting wire.

Another application is shown in FIG. 48. As shown in FIG. 48, the memory card or the card holder to which the memory card is inserted, is inserted to a connecting apparatus. The connecting apparatus is connected to PC (Personal Computer) via connecting wire.

Figure 49:
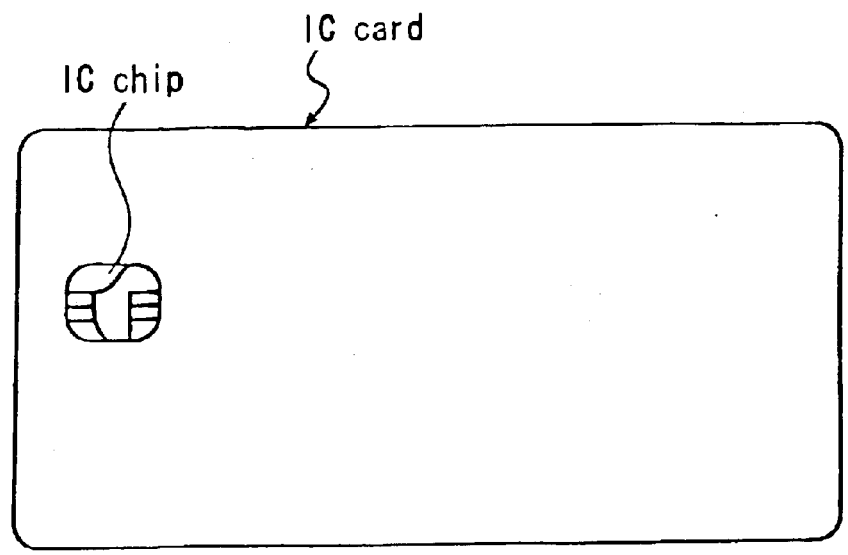
FIG. 49 shows a diagram of an IC chip including a semiconductor memory device, and an IC card on which the IC card is allocated.
Figure 50:
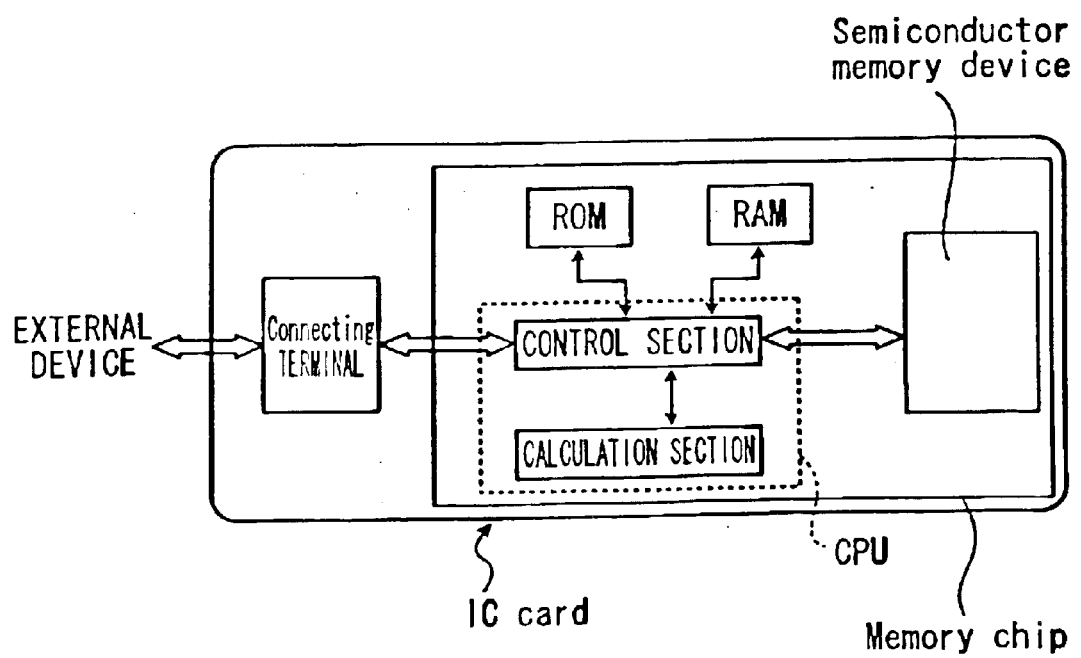
FIG. 50 shows a schematic diagram of an IC card and an IC chip.

Another application is shown in FIGS. 49 and 50. As shown in FIG. 49, An IC chip that includes the above-mentioned semiconductor memory device is located on an IC card that is made of plastic or something like that. FIG. 50 shows a detail block diagram of the IC card and the IC chip presented in FIG. 49. The IC chip has a connecting terminal that is configured to connect to an external device (not shown), and a memory chip that includes the above-mentioned semiconductor memory device, a ROM, a RAM, and a CPU. The CPU contains a calculation section and a control section that is configured to connect to the semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A nonvolatile memory device having a gate electrode comprising:
   a non volatile memory cell configured to store data, and having a first gate electrode, first and second diffusion layers, the first gate electrode having a first top surface and a first side surface;
   a peripheral transistor having a second gate electrode, third and fourth diffusion layers, the second gate electrode having a second top surface and a second side surface, and a width between the third and fourth diffusion layers of the second gate electrode being wider than that between the first and second diffusion layers of the first gate electrode;
   a first contact layer connected to the second top surface of the second gate electrode of the peripheral transistor; and
   a silicon nitride layer formed above the first side surface of the first gate electrode in the non volatile memory cell and the second side surface of the second gate electrode in the peripheral transistor, the silicon nitride layer not being contact with the first contact layer, a thickness of the silicon nitride layer that is formed above the first and second side surfaces of the first and second gate electrodes being uniform approximately.

2. The nonvolatile memory device having a gate electrode according to claim 1, wherein the silicon nitride layer extended on the first top surface of the first gate electrode in the volatile memory cell.

3. The nonvolatile memory device having a gate electrode according to claim 1, further comprising a second contact layer connected to the third diffusion layer of the peripheral transistor.

4. The nonvolatile memory device having a gate electrode according to claim 3, wherein the silicon nitride layer extended on the third diffusion layer of the peripheral transistor, the second contact layer being contact with the silicon nitride layer.

5. The nonvolatile memory device having a gate electrode according to claim 4, wherein the non volatile memory cell has a floating gate.

6. A memory card including the nonvolatile memory device recited in claim 1.

7. A card holder to which the memory card recited in claim 6 is inserted.

8. A connecting device to which the memory card recited in claim 6 is inserted.

9. The connecting device according to the claim 8, the connecting device is configured to be connected to a computer.

10. A memory card including the nonvolatile memory device recited in claim 1 and a controller which controls the nonvolatile memory device.

11. A card holder to which the memory card recited in claim 10 is inserted.

12. A connecting device to which the memory card recited in claim 10 is inserted.

13. The connecting device according to the claim 12, the connecting device is configured to be connected to a computer.

14. An IC card on which an IC chip that includes the nonvolatile memory device recited in claim 1 is located.

15. A nonvolatile memory device having a gate electrode comprising:
   a non volatile memory cell configured to store data, and having a first gate electrode, first and second diffusion layers, the first gate electrode having a first top surface and a first side surface;
   a peripheral transistor having a second gate electrode, third and fourth diffusion layers, the second gate electrode having a second top surface and a second side surface, and a width between the third and fourth diffusion layers of the second gate electrode being wider than that between the first and second diffusion layers of the first gate electrode;
   a first contact layer connected to the second top surface of the second gate electrode of the peripheral transistor;
   an insulation layer which is directly formed on the top surface of the second gate electrode in the peripheral transistor;
   a silicon nitride layer formed above the first side surface of the first gate electrode in the non volatile memory cell and the second side surface of the second gate electrode in the peripheral transistor; and
   an interlayer insulting layer that is formed above the nonvolatile memory cell and the peripheral transistor and is directly contact with the first contact layer and the insulation layer.

16. The nonvolatile memory device having a gate electrode according to claim 15, further comprising a second contact layer connected to the third diffusion layer of the peripheral transistor.

17. The nonvolatile memory device having a gate electrode according to claim 15, wherein the silicon nitride layer extended on the third diffusion layer of the peripheral transistor, the second contact layer being contact with the silicon nitride layer.

18. The nonvolatile memory device having a gate electrode according to claim 15, wherein the non volatile memory cell has a floating gate.

19. A memory card including the nonvolatile memory device recited in claim 15.

20. A card holder to which the memory card recited in claim 19 is inserted.

21. A connecting device to which the memory card recited in claim 19 is inserted.

22. The connecting device according to the claim 21, the connecting device is configured to be connected to a computer.

23. A memory card including the nonvolatile memory device recited in claim 15 and a controller which controls the nonvolatile memory device.

24. A card holder to which the memory card recited in claim 23 is inserted.

25. A connecting device to which the memory card recited in claim 23 is inserted.

26. The connecting device according to the claim 25, the connecting device is configured to be connected to a computer.

27. An IC card on which an IC chip that includes the nonvolatile memory device recited in claim 15 is located.

* * * * *